(12) United States Patent
Onoda et al.

(10) Patent No.: US 6,387,745 B1
(45) Date of Patent: May 14, 2002

(54) METHOD OF MAKING A SEMICONDUCTOR DEVICE HAVING A POLYDIODE ELEMENT

(75) Inventors: Hiroshi Onoda; Masaaki Mihara; Hiroshi Takada, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,715

(22) Filed: Dec. 10, 1999

Related U.S. Application Data

(62) Division of application No. 09/115,518, filed on Jul. 15, 1998, now Pat. No. 6,180,996.

(30) Foreign Application Priority Data

Feb. 6, 1998 (JP) ............................................. 10-025861

(51) Int. Cl.[7] ......................................... H01L 21/8234
(52) U.S. Cl. ..................... 438/237; 438/385; 438/532
(58) Field of Search ................................ 438/237, 258, 438/384, 385, 532

(56) References Cited

U.S. PATENT DOCUMENTS

| | | | |
|---|---|---|---|
| 4,616,404 A | 10/1986 | Wang et al. | 438/532 |
| 4,835,111 A | * 5/1989 | Wright et al. | 438/532 |
| 5,348,901 A | 9/1994 | Chen et al. | 438/385 |
| 5,485,031 A | 1/1996 | Zhang et al. | 257/530 |
| 5,554,552 A | 9/1996 | Chi | 438/264 |
| 5,591,661 A | * 1/1997 | Shiota | 438/237 |
| 5,594,278 A | 1/1997 | Uchiyama | 257/751 |
| 5,852,311 A | 12/1998 | Kwon et al. | 257/315 |
| 5,970,338 A | * 10/1999 | Tempel | 438/384 |

FOREIGN PATENT DOCUMENTS

| | | | |
|---|---|---|---|
| JP | 57-26456 | * | 2/1982 |
| JP | 7-283311 | | 10/1995 |

OTHER PUBLICATIONS

"Design of CMOS VLSI", by Tetsuya Iizuka, Baifu–Kan, pp. 192–193.
"TA 7.2: A 3.3V–Only 16 Mb DINOR Flash Memory", by S. Kobayashi, 1995 IEEE International Solid–State Circuits Conference, pp. 122–123.
"Lateral Polysilicon p–n Diodes", by M. Dutoit et al., J. Electrochem. Soc.: Solid–State Science and Technology, vol. 125, Oct. 1978, pp. 1648–1651.
"A 1.5 V Single–Supply One–Tansistor CMOS EEPROM", by B. Gerber et al., IEEE Journal of Solid–State Circuits, vol. SC–16, No. 3, Jun. 1981, pp. 195–200.
"Low Voltage Single Supply CMOS Electrically Erasable Read–Only Memory", by B. Gerber et al., IEEE Transactions on Electron Devices, vol. ED–27, No. 7, Jul. 1980, p. 1211–1216.
"Silicon–Gate CMOS Frequency Divider for the Electronic Wrist Watch", by E. Vittoz et al., IEEE Journal of Solid–State Circuits, vol. SC–7, No. 2, Apr. 1972, pp. 100–104.

* cited by examiner

*Primary Examiner*—Chandra Chaudhari
(74) *Attorney, Agent, or Firm*—McDermott, Will & Emery

(57) ABSTRACT

An aluminum wire is connected to a P-type layer of a polydiode element through a resistive element consisting of a barrier metal film and a tungsten plug. Another aluminum wire is connected to an N-type layer of the polydiode element through another resistive element consisting of another barrier metal film and another tungsten plug. Thus, a semiconductor device including a polydiode element which is resistant to surge or contamination is provided.

4 Claims, 27 Drawing Sheets

FIG.1A
FIG.1B
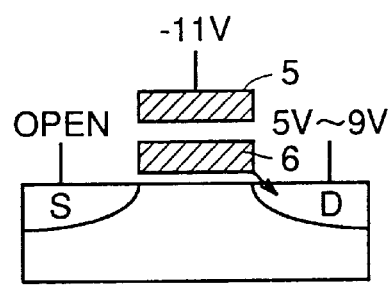
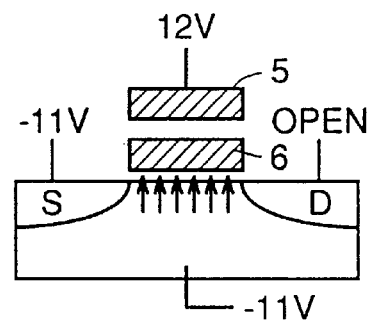

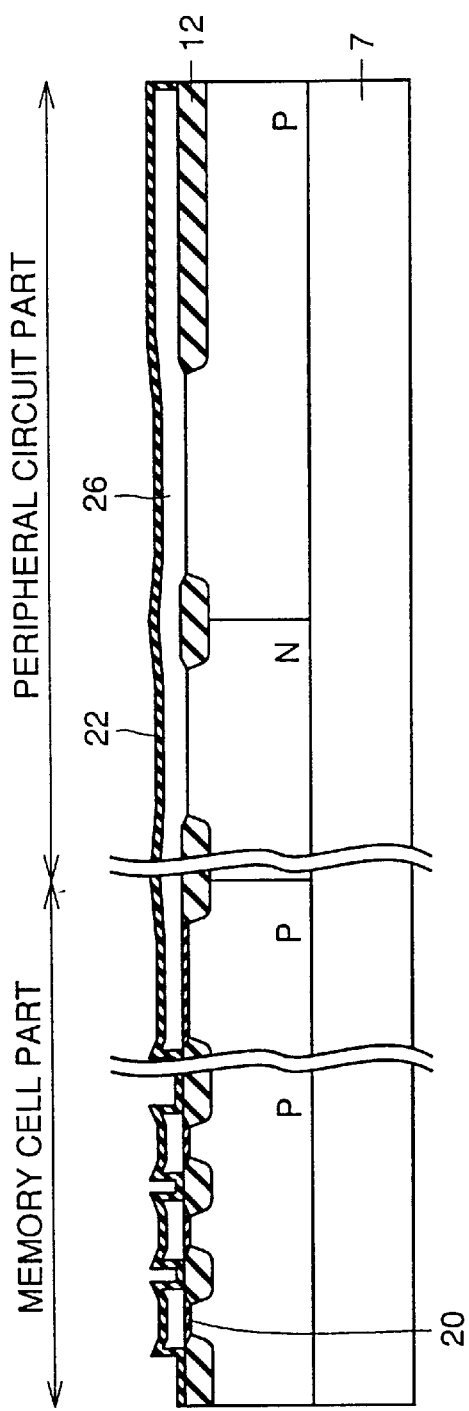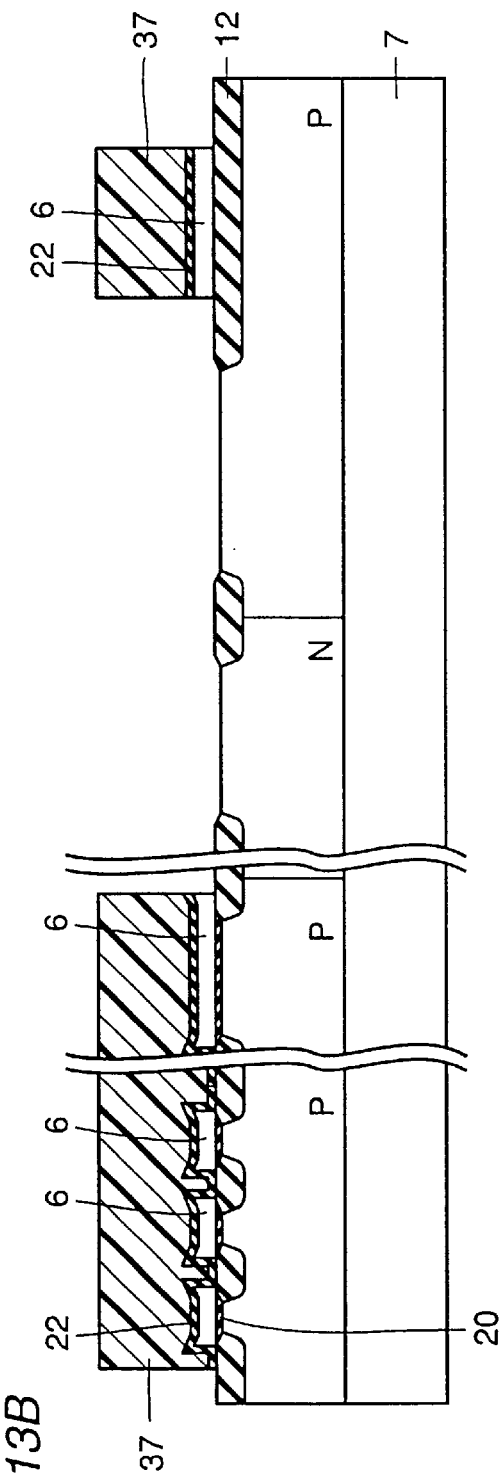

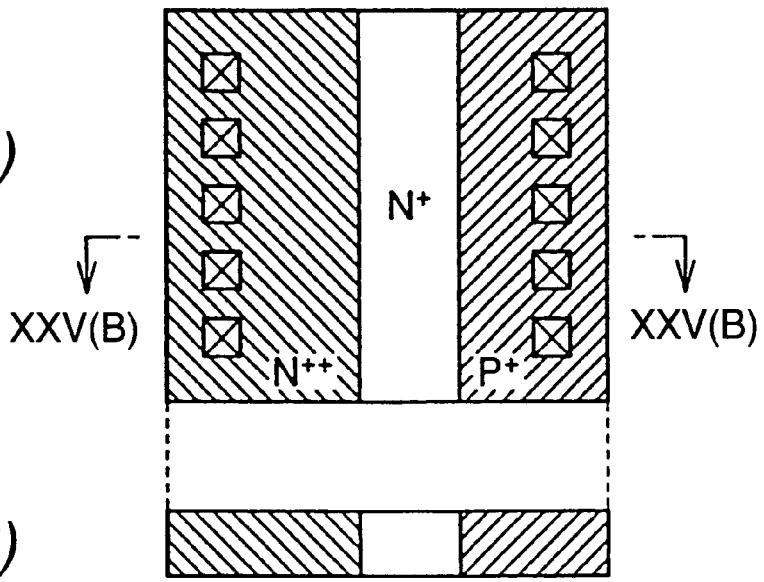
FIG.25(A)
FIG.25(B)
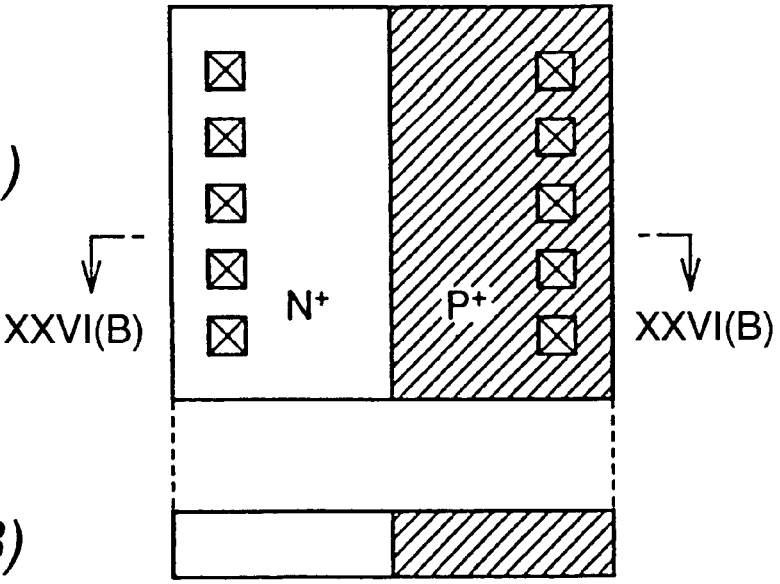
FIG.26(A)
FIG.26(B)

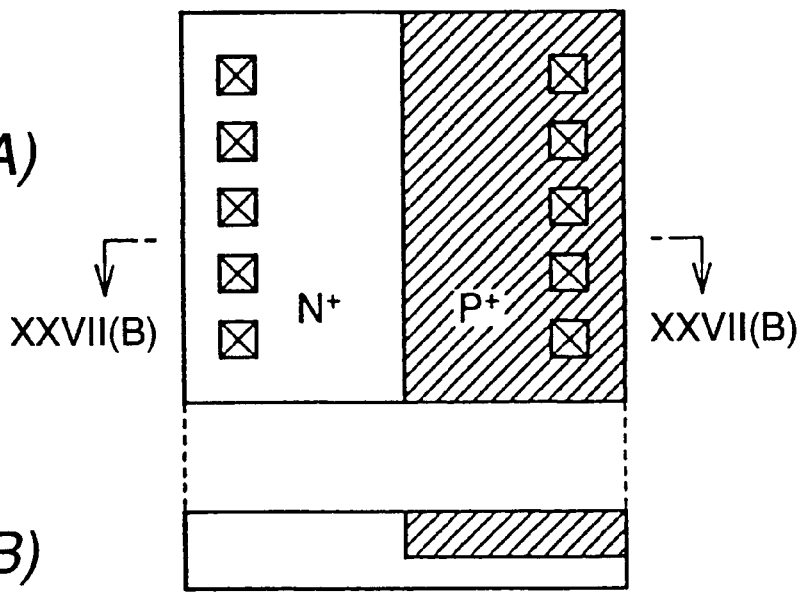
FIG.27(A)
FIG.27(B)
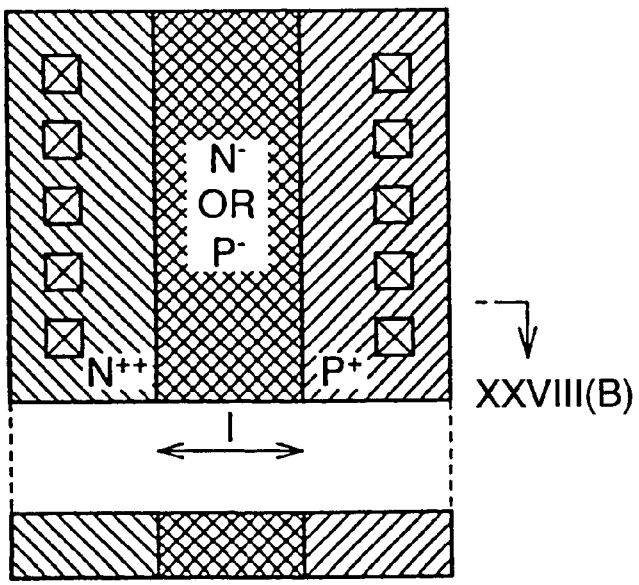
FIG.28(A)
FIG.28(B)

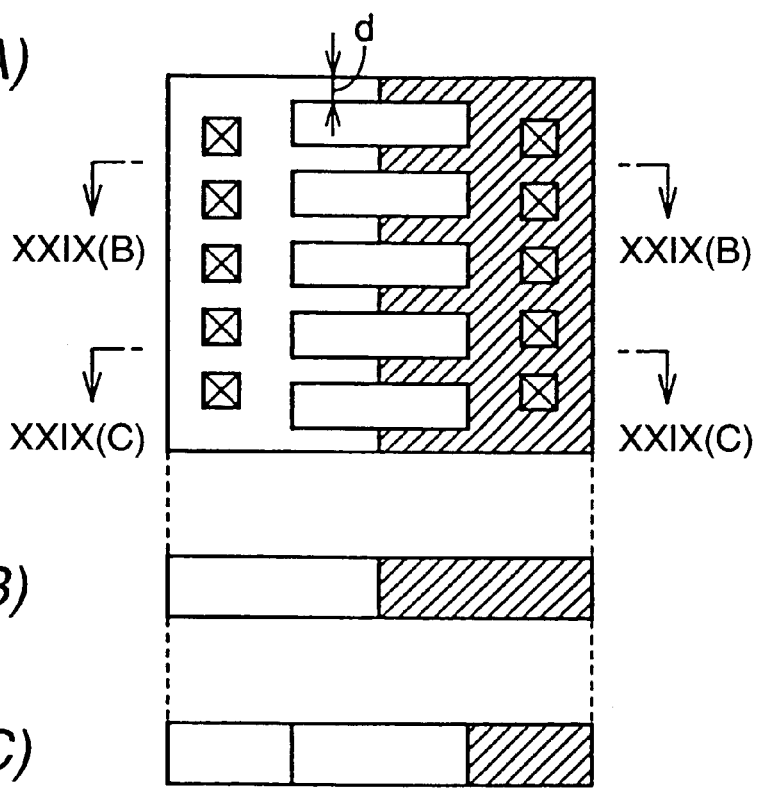
FIG.29(A)
FIG.29(B)
FIG.29(C)
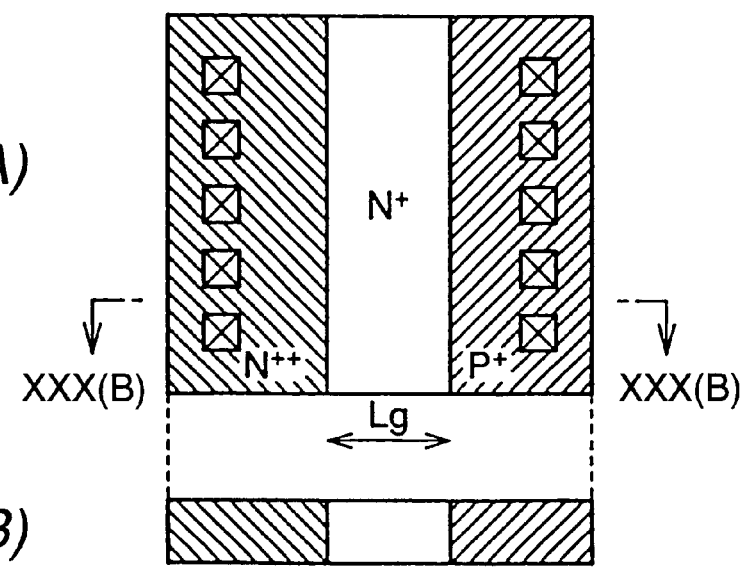
FIG.30(A)
FIG.30(B)

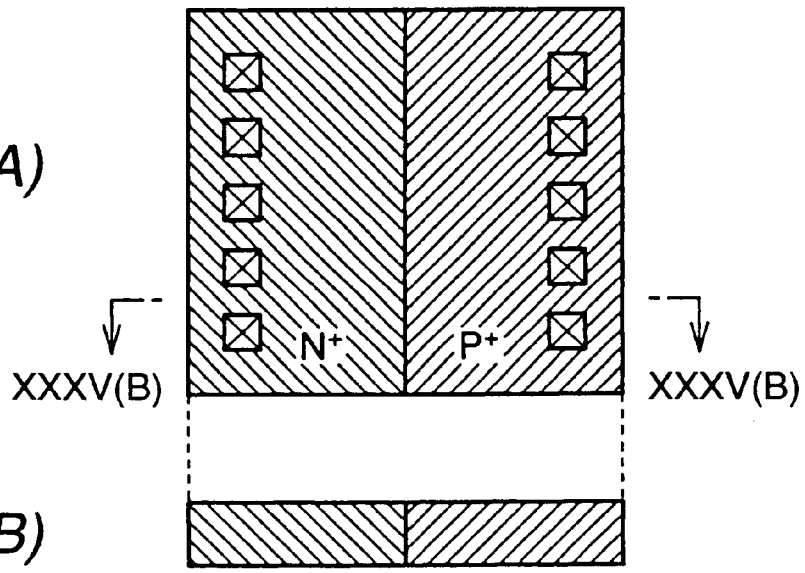
FIG.35(A)
FIG.35(B)
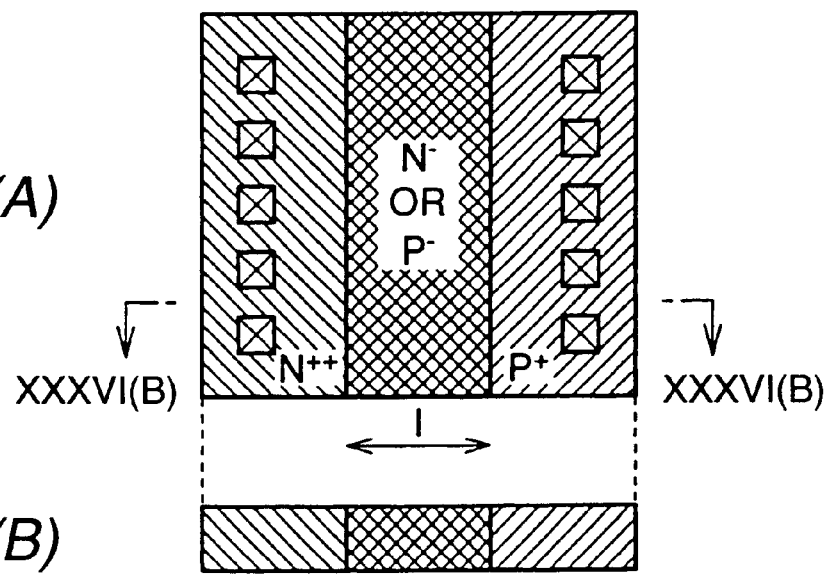
FIG.36(A)
FIG.36(B)

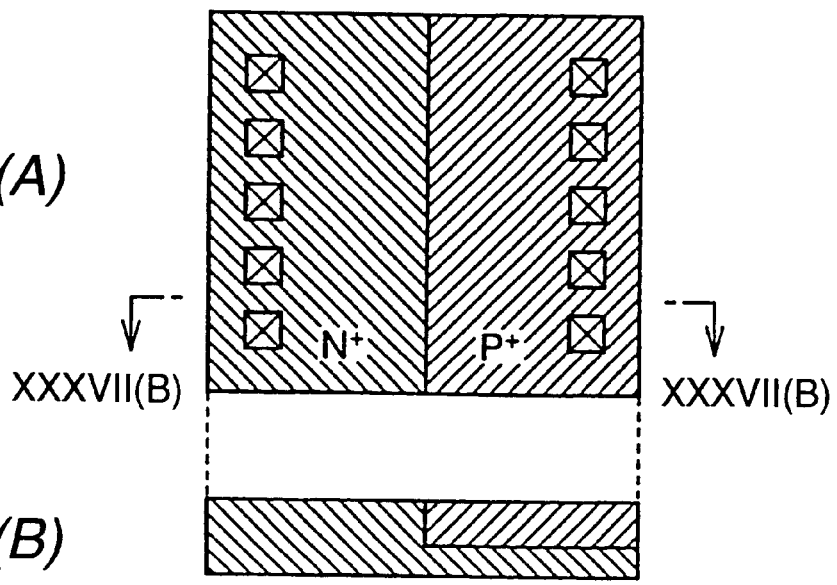
FIG.37(A)
FIG.37(B)
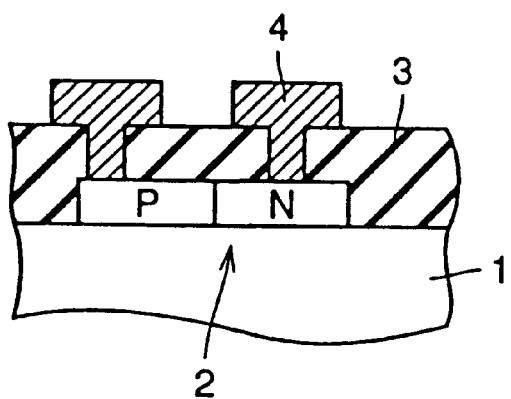
FIG.38  PRIOR ART

METHOD OF MAKING A SEMICONDUCTOR DEVICE HAVING A POLYDIODE ELEMENT

This application is a divisional of application Ser. No. 09/115,518 filed Jul. 15, 1998, now U.S. Pat. No. 6,180,996.

BACKGROUND OF THE INVENTION

1. Field of the Invention

The present invention generally relates to a semiconductor device, and more specifically, it relates to a semiconductor device having a polydiode element which is improved to be resistant to surge or contamination.

2. Description of the Prior Art

A nonvolatile semiconductor device, which requires a high voltage (10 to 20 V in general) for a write/erase operation for a memory cell, has generally required two external power sources (Vpp/Vcc, Vpp: a high voltage of about 12 V). In recent years, however, a single power source Vcc is employed for attaining commonness with other devices. In this case, the nonvolatile semiconductor device is provided in its chip with a built-in circuit for stepping up the power supply voltage Vcc to the high voltage Vpp.

A charge-pump step-up circuit, which is generally employed in an LSI, has various problems. A textbook "Design of CMOS VLSI" (Baifu-Kan, pp. 192 to 193) describes an exemplary charge-pump step-up circuit, its principle and its problems. According to this literature, the charge-pump step-up circuit serially connects a MOS diode with a unit of a capacitance and performs a step-up operation with two clocks of different timing. However, a rectifying device is formed by the MOS diode. The threshold voltage vth of the MOS diode gradually increases as the number of stages increases due to a substrate bias effect, and hence step-up efficiency is disadvantageously deteriorated with the number of stages.

IEEE International Solid-State Circuits Conference (1995) TA7.2 discloses a charge-pump step-up circuit forming a P-N junction diode on a substrate not by a MOS diode but through a triple well structure of the substrate. In this case, the efficiency is not deteriorated by the substrate bias effect. However, the process is complicated to increase the cost due to formation of the triple well structure. Further, the capacitance between an N well and the substrate serves as a parasitic capacitance due to formation on the substrate, to disadvantageously deteriorate the efficiency.

FIG. 38 shows an EEPROM comprising a charge-pump step-up circuit utilizing a P-N junction diode (hereinafter referred to as a polydiode element) 2 employing polysilicon, which is disclosed in "Lateral Polysilicon p-n Diodes (J. Electrochem. Soc., Vol. 125, October 1978, p. 1648). This EEPROM also appears in IEEE J. Solid-State Circuits, Vol. SC-16, June 1981, p. 195 and IEEE Trans. Electron Devices, Vol. ED-27, July 1980, p. 1211.

Referring to FIG. 38, the polydiode element 2 is formed on an $SiO_2$ film 1. An interlayer isolation film 3 is formed on the $SiO_2$ film 1, to cover the polydiode element 2. Aluminum wires 4 are connected to a P-type layer and an N-type layer of the polydiode element 2 through contact holes provided in the interlayer isolation film 3.

In case of employing the polydiode element 2 shown in FIG. 38, no problem of a substrate bias effect or a parasitic capacitance is caused dissimilarly to the case of employing a MOS diode or a P-N diode formed on a substrate. However, the aluminum wires 4 are directly electrically in contact with the polydiode element 2 to cause reaction on the interfaces therebetween, to disadvantageously result in dispersion of contact resistance as well as dispersion of the characteristics of the polydiode element 2. Further, such a conventional polydiode element 2 is not resistant to electrical noise such as surge. Further, the conventional polydiode element 2 shown in FIG. 38 is not resistant to contamination.

SUMMARY OF THE INVENTION

In order to solve the aforementioned problems, an object of the present invention is to provide a semiconductor device having a high-performance polydiode element (P-N junction element).

Another object of the present invention is to provide a charge-pump step-up circuit of high performance with such a polydiode element.

Still another object of the present invention is to provide a high-performance nonvolatile semiconductor memory device with such a step-up circuit.

A further object of the present invention is to provide a method of fabricating a semiconductor device having such a polydiode element with neither additional step nor excess cost.

A semiconductor device according to a first aspect of the present invention comprises a semiconductor substrate having a major surface. An element isolation oxide film is provided on the major surface of the semiconductor substrate. A polydiode element having a P-type layer and an N-type layer is provided on the element isolation oxide film. An interlayer isolation film is provided on the major surface of the semiconductor substrate, to cover the polydiode element. A first contact hole exposing the P-type layer and a second contact hole exposing the N-type layer are provided in the interlayer isolation film. A first resistive element connected with the P-type layer is provided in the first contact hole. A second resistive element connected with the N-type layer is provided in the second contact hole. A first wiring layer is connected to the P-type layer through the first resistive element. A second wiring layer is connected to the N-type layer through the second resistive element.

According to this aspect of the present invention, the first wiring layer is connected to the P-type layer through the first resistive element and the second wiring layer is connected to the N-type layer through the second resistive element, whereby the semiconductor device is resistant to electrical noise such as surge.

According to a second aspect of the present invention, the semiconductor device further includes a nonvolatile semiconductor storage element, which is formed on the semiconductor substrate, having a floating gate of polysilicon, and the polydiode element is made of the same material as the floating gate.

According to this aspect of the present invention, the polydiode element, which is made of the same material as the floating gate, can be formed simultaneously with the floating gate, whereby the semiconductor device can be fabricated with no additional step.

According to a third aspect of the present invention, the first and second resistive elements of the semiconductor device are formed by barrier metals and/or tungsten plugs. Thus, the first and second resistive elements can be made of general materials.

According to a fourth aspect of the present invention, the N-type layer of the semiconductor device consists of an $N^+$-type layer which is connected with the P-type layer and an $N^{++}$-type layer which is connected with this $N^+$-type layer.

According to this aspect of the present invention, the forward characteristic of the polydiode element is improved.

According to a fifth aspect of the present invention, the polydiode element of the semiconductor device is built in a charge-pump step-up circuit as a part thereof.

According to this aspect of the present invention, the polydiode element having the aforementioned characteristics is built in the charge-pump step-up circuit as a part thereof, whereby the charge-pump step-up circuit is resistant to electrical noise such as surge.

A semiconductor device according to a sixth aspect of the present invention relates to a nonvolatile semiconductor memory device. The semiconductor device comprises a semiconductor substrate. A nonvolatile semiconductor storage element having a floating gate, a control gate and an interpoly dielectric film provided between the floating gate and the control gate is formed on the semiconductor substrate. An element isolation oxide film is formed on a surface of the semiconductor substrate. A polydiode element having a P-type layer and an N-type layer of the same material as the floating gate is provided on the element isolation oxide film. An interlayer isolation film is provided on the semiconductor substrate, to cover the polydiode element. A first contact hole exposing the P-type layer and a second contact hole exposing the N-type layer are provided in the interlayer isolation film. A first resistive element connected with the P-type layer is provided in the first contact hole. A second resistive element connected with the N-type layer is provided in the second contact hole. A first wiring layer is connected to the P-type layer through the first resistive element. A second wiring layer is connected to the N-type layer through the second resistive element.

According to this aspect of the present invention, the first wiring layer is connected to the P-type layer through the first resistive element and the second wiring layer is connected to the N-type layer through the second resistive element, thereby providing a nonvolatile semiconductor memory device which is resistant to electrical noise such as surge.

A semiconductor device according to a seventh aspect of the present invention relates to a nonvolatile semiconductor memory device comprising a charge-pump step-up circuit. This semiconductor device comprises a semiconductor substrate. A nonvolatile semiconductor storage element having a floating gate and a charge-pump step-up circuit are formed on the semiconductor substrate. The charge-pump step-up circuit comprises an element isolation oxide film which is formed on a surface of the semiconductor substrate and a polydiode element, formed on the element isolation oxide film, having a P-type layer and an N-type layer of the same material as the floating gate. An interlayer isolation film is provided on the semiconductor substrate, to cover the polydiode element. A first contact hole exposing the P-type layer and a second contact hole exposing the N-type layer are provided in the interlayer isolation film. A resistive element connected with the P-type layer is provided in the first contact hole. A second resistive element connected with the N-type layer is provided in the second contact hole. A first wiring layer is connected to the P-type layer through the first resistive element. A second wiring layer is connected to the N-type layer through the second resistive element.

According to this aspect of the present invention, the first wiring layer is connected to the P-type layer through the first resistive element and the second wiring layer is connected to the N-type layer through the second resistive element, thereby providing a nonvolatile semiconductor memory device comprising the charge-pump step-up circuit which is resistant to electrical noise such as surge.

According to an eighth aspect of the present invention, the semiconductor device further comprises a protective film covering at least an upper portion of the polydiode element.

According to this aspect of the present invention, the protective film covers at least the upper portion of the polydiode element, whereby the semiconductor device is resistant to contamination.

According to a ninth aspect of the present invention, the semiconductor device further comprises a protective film covering at least an upper portion of the polydiode element, and this protective film is made of the same material as the interpoly dielectric film.

According to this aspect of the present invention, the protective film is made of the same material as the interpoly dielectric film, whereby a semiconductor device resistant to contamination can be obtained with no additional step.

According to a tenth aspect of the present invention, the polydiode element of the semiconductor device is made of non-doped polysilicon.

According to this aspect of the present invention, the polydiode element which is made of non-doped polysilicon can be worked into any conductive type.

A semiconductor device according to an eleventh aspect of the present invention relates to a nonvolatile semiconductor memory device. The semiconductor device comprises a semiconductor substrate, a nonvolatile semiconductor storage element and a polydiode element which are formed on the semiconductor substrate. The nonvolatile semiconductor element includes (A) a floating gate of N-type polysilicon which is formed on the semiconductor substrate, (B) an interpoly dielectric film, provided on the floating gate, consisting of a multilayer film of an oxide film and a nitride film, and (C) a control gate, provided on the interpoly dielectric film, having a lower layer of N-type polysilicon and an upper layer of metal silicide. The polydiode element comprises an element isolation oxide film which is provided on a major surface of the semiconductor substrate. A P-N junction polysilicon layer having a P-type layer and an N-type layer is provided on the element isolation oxide film. An interlayer isolation film is provided on the semiconductor substrate, to cover the P-N junction polysilicon layer. A first contact hole exposing the P-type layer and a second contact hole exposing the N-type layer are provided in the interlayer isolation film. A first resistive element, consisting of a barrier metal and/or a tungsten plug, connected with the P-type layer is provided in the first contact hole. A second resistive element,t consisting of a barrier metal and/or a tungsten plug, connected with the N-type layer is provided in the second contact hole. A first wiring layer is connected to the P-type layer through the first resistive element. A second wiring layer is connected to the N-type layer through the second resistive element.

According to this aspect of the present invention, the first wiring layer is connected to the P-type layer through the first resistive element and the second wiring layer is connected to the N-type layer through the second resistive element, whereby a nonvolatile semiconductor memory device which is resistant to electrical noise such as surge is obtained.

A method of fabricating a semiconductor device according to a twelfth aspect of the present invention relates to a method of fabricating a semiconductor device having a peripheral circuit PMOS transistor and a polydiode element. First, an element isolation oxide film is formed on a surface of a semiconductor substrate. A polysilicon layer serving as the matrix for the polydiode element is formed on the element isolation oxide film. Simultaneously with $P^+$ ion implantation for forming a source/drain region of the PMOS transistor, P+ ions are injected into the polysilicon layer, thereby forming a P-type layer of the polydiode element. An N-type layer of the polydiode element is formed. The PMOS transistor is formed on the semiconductor substrate.

According to this aspect of the present invention, P+ ions are injected into the polysilicon layer simultaneously with P+ ion implantation for forming the source/drain region of the PMOS transistor, thereby forming the P-type layer of the polydiode element. Thus, the polydiode element can be formed with no additional step.

A method of fabricating a semiconductor device according to a thirteenth aspect of the present invention relates to a method of fabricating a semiconductor device having a peripheral circuit NMOS transistor and a polydiode element. First, an element isolation oxide film is formed on a surface of a semiconductor substrate. A polysilicon layer serving as the matrix for the polydiode element is formed on the element isolation oxide film. Simultaneously with N+ ion implantation for forming a source/drain region of the NMOS transistor, N+ ions are injected into the polysilicon layer, thereby forming an N-type layer of the polydiode element. A P-type layer of the polydiode element is formed. The NMOS transistor is formed on the semiconductor substrate.

According to this aspect of the present invention, N+ ions are injected into the polysilicon layer simultaneously with N+ ion implantation for forming the source/drain region of the NMOS transistor, thereby forming the N-type layer of the polydiode element. Thus, the polydiode element can be formed with no additional step.

A method of fabricating a semiconductor device according to a fourteenth aspect of the present invention relates to a method of fabricating a semiconductor device having an NMOS memory cell transistor and a polydiode element. First, an element isolation oxide film is-formed on a surface of a semiconductor substrate. A polysilicon layer serving as the matrix for the polydiode element is formed on the element isolation oxide film. Simultaneously with N+ ion implantation for forming a source/drain region of the NMOS memory cell transistor, N+ ions are injected into the polysilicon layer, thereby forming an N-type layer of the polydiode element. A P-type layer of the polydiode element is formed. The NMOS memory cell transistor is formed on the semiconductor substrate.

According to this aspect of the present invention, N+ ions are injected into the polysilicon layer simultaneously with N+ ion implantation for forming the source/drain region of the NMOS memory cell transistor, thereby forming the N-type layer of the polydiode element. Thus, the polydiode element can be formed with no additional step.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are adapted to illustrate write and erase operations for a memory cell of a DINOR flash memory, one of nonvolatile semiconductor memory devices to which the present invention is applied;

FIGS. 13A and 13B are sectional views of a semiconductor device showing a method of fabricating the polydiode element according to Example 2 of the present invention;

FIG. 25(A) shows a plan view of a polydiode element according to Example 7 of the present invention and FIG. 25(B) shows a sectional view taken along the line XXV(B)—XXV(B);

FIG. 26(A) shows a plan view of a polydiode element according to Example 8 of the present invention and FIG. 26(B) shows a sectional view taken along the line XXVI(B)—XXVI(B);

FIG. 27(A) shows a plan view of a polydiode element according to Example 9 of the present invention and FIG. 27(B) shows a sectional view taken along the line XXVII(B)—XXVII(B);

FIG. 28(A) shows a plan view of a polydiode element according to Example 10 of the present invention and FIG. 28(B) shows a sectional view taken along the line XXVIII(B)—XXVIII(B);

FIG. 29(A) shows a plan view of a polydiode element according to Example 11 of the present invention and FIG. 29(B), FIG. 29(C) show sectional views taken along the lines XXIX(B)—XXIX(B) and XXIX(C)—XXIX(C) respectively;

FIG. 30(A) shows a plan view of a polydiode element according to Example 12 of the present invention and FIG. 30(B) shows a sectional view taken along the line XXX(B)—XXX(B);

FIG. 35(A) shows a plan view of a polydiode element according to Example 13 of the present invention and FIG. 35(B) shows a sectional view taken along the line XXXV(B)—XXXV(B);

FIG. 36(A) shows a plan view of a polydiode element according to Example 14 of the present invention and FIG. 36(B) shows a sectional view taken along the line XXXVI(B)—XXXVI(B);

FIG. 37(A) shows a plan view of a polydiode element according to Example 15 of the present invention and FIG. 37(B) shows a sectional view taken along the line XXXVII(B)—XXXVII(B); and FIG. 38 is a sectional view of a conventional polydiode element.

DESCRIPTION OF THE PREFERRED EMBODIMENTS

First, description is made on write and erase operations of a DINOR flash memory, one of nonvolatile semiconductor memory devices to which the present invention is applied.

Referring to FIGS. 1A and 1B, a power supply voltage of 3.3 V is applied to a control gate 5 in reading for detecting whether a memory cell is turned on or in an OFF state, thereby determining "1" or "0". The write (program) operation is performed by applying voltages of −11 V and 5 to 9 V to the control gate 5 and a drain diffusion layer respectively and extracting electrons stored in a floating gate 6. The threshold value of the memory cell is reduced by the write operation. On the other hand, the erase operation is performed by applying voltages of 12 V and −11 V to the control gate 5 and a P well respectively and injecting electrons into the floating gate 6. Thus, the threshold value of the memory cell is increased. Such a nonvolatile semiconductor memory cell generally requires a high voltage for its operations, dissimilarly to other volatile semiconductor memories.

Figure 2:
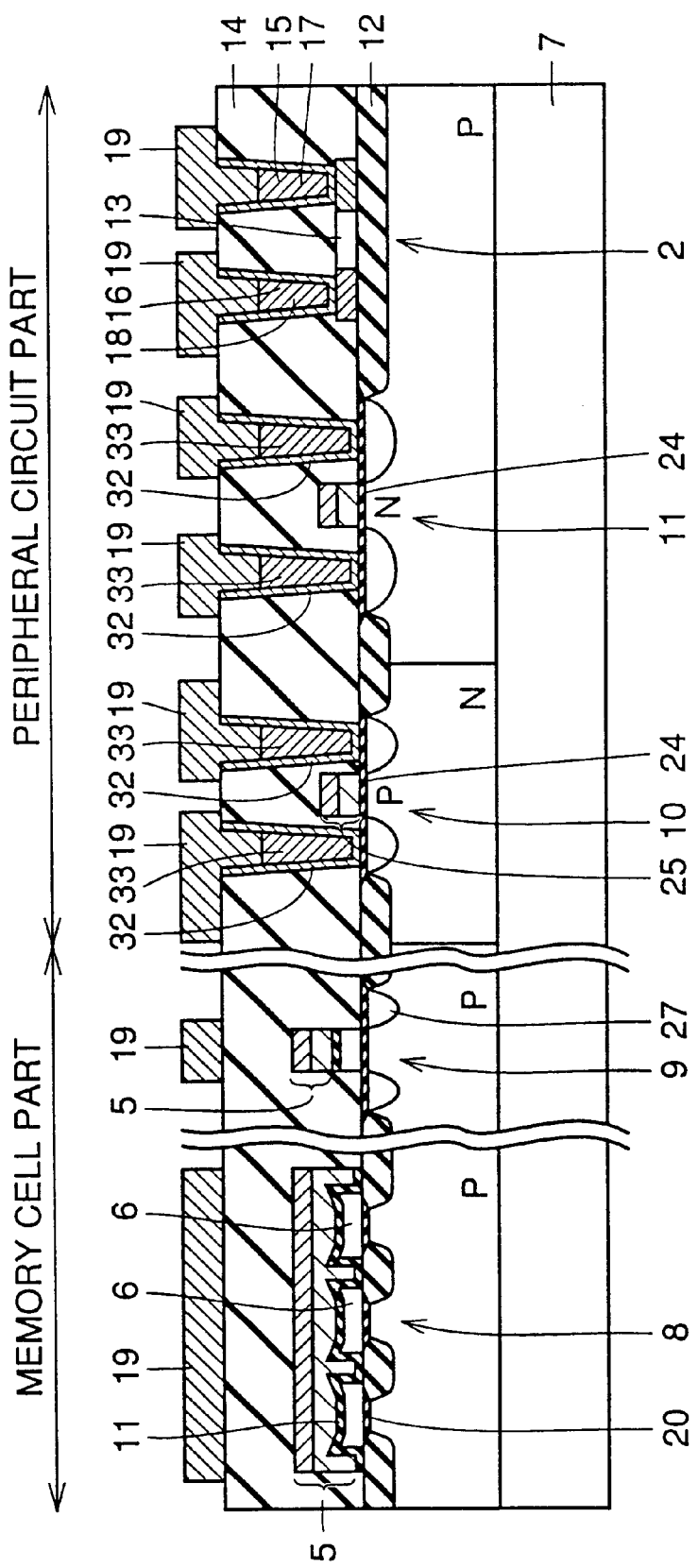
FIG. 2 is a sectional view of a nonvolatile semiconductor memory device according to an embodiment of the present invention.

FIG. 2 is a sectional view of a nonvolatile semiconductor memory device according to an embodiment of the present invention. Nonvolatile semiconductor storage elements 8, a memory cell transistor 9, a peripheral circuit PMOS transistor 10, a peripheral circuit NMOS transistor 11 and a polydiode element 2 are provided on a semiconductor substrate 7. FIG. 2 illustrates the nonvolatile semiconductor storage elements 8 and the memory cell transistor 9 in sections along word line and bit line directions respectively. This also applies to the remaining figures. Each nonvolatile semiconductor storage element 8 includes a floating gate 6 which is made of N-type polysilicon, an interpoly dielectric film 11, provided on the semiconductor substrate 7 to cover the floating gate 6, consisting of a multilayer film of an oxide film and a nitride film, and a control gate 5, provided to cover the floating gate 6 through the interpoly dielectric film 11, having a lower layer of N-type polysilicon and an upper layer of metal silicide. The polydiode element 2 includes an element isolation oxide film 12 provided on a major surface of the semiconductor substrate 7. A P-N junction polysilicon layer 13 having a P-type layer and an N-type layer is provided on the element isolation oxide film 12. An interlayer isolation film 14 is provided on the semiconductor substrate 7, to cover the P-N junction polysilicon layer 13. A first contact hole 15 exposing the P-type layer and a second contact hole 16 exposing the N-type layer are provided in the interlayer isolation film 14. A first resistive element 17, which is connected with the P-type layer, consisting of a barrier metal and a tungsten plug is provided in the first contact hole 15. A second resistive element 18, which is connected with the N-type layer, consisting of a barrier metal and a tungsten plug is provided in the second contact hole 16. Wiring layers 19 are connected to the P-type and N-type layers through the first and second resistive elements 17 and 18 respectively. Due to the presence of the first and second resistive elements 17 and 18, the polydiode element 2 is resistant to electrical noise such as surge.

A method of fabricating the nonvolatile semiconductor memory device shown in FIG. 2 is now described.

Figure 3:
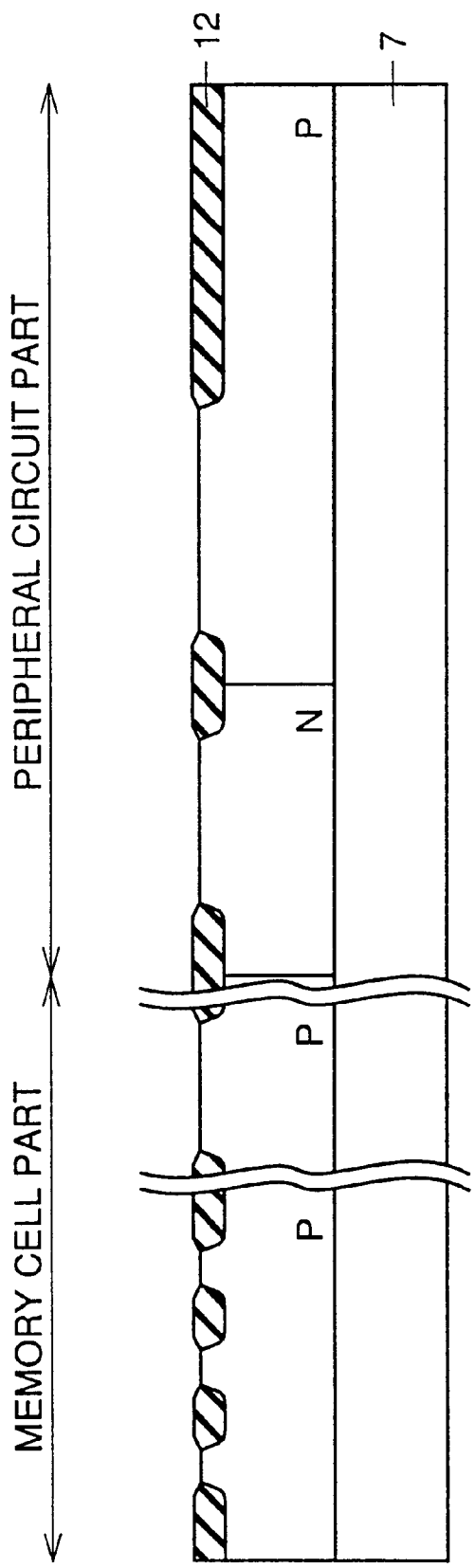
FIG. 3 is a sectional view showing a first step of a method of fabricating the nonvolatile semiconductor memory device according to the embodiment of the present invention.

Referring to FIG. 3, the element isolation oxide film 12 and P- and N-wells are formed on the major surface of the semiconductor substrate 7 of silicon.

Figure 4:
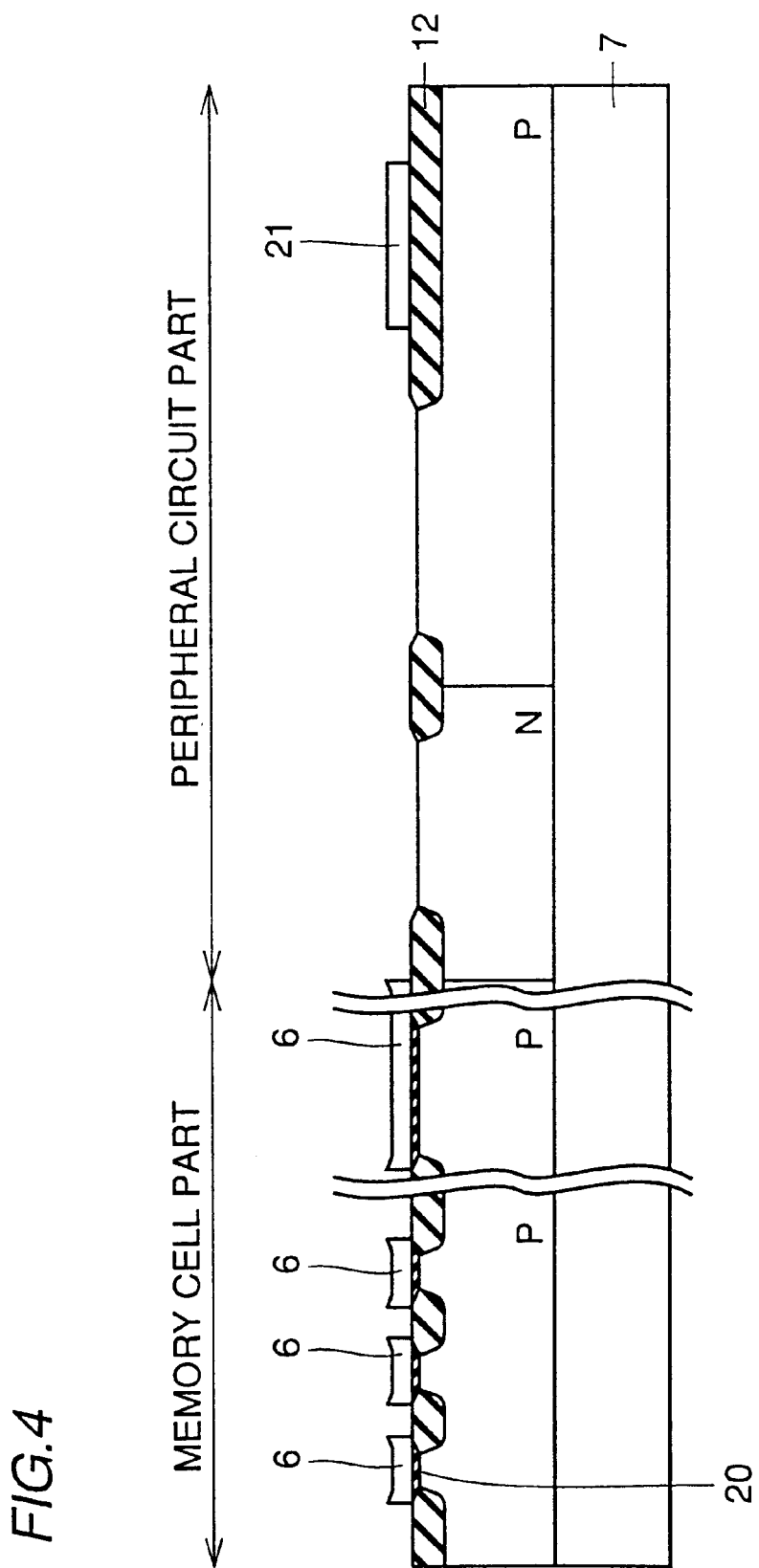
FIG. 4 is a sectional view showing a second step of the method of fabricating the nonvolatile semiconductor memory device according to the embodiment of the present invention.

Referring to FIG. 4, tunnel oxide films 20 for memory cells are formed by thermal oxidation. Phosphorus-doped N-type polysilicon having a phosphorus concentration of about $1 \times 10^{20}$ atoms/cm$^3$ (employable in the range of $5 \times 10^{19}$ atoms/cm$^3$ to $2 \times 10^{20}$ atoms/cm$^3$) is deposited by low-pressure CVD in a thickness of about 100 nm (this is hereinafter referred to as a floating gate material). The floating gate material is etched through photolithography and worked into stripes in a memory cell part along the bit line direction, thereby obtaining the floating gates 6. In a peripheral circuit part, the floating gate material is worked into a matrix part 21 for the polydiode element 2. The remaining part of the floating gate material is entirely removed.

Figure 5:
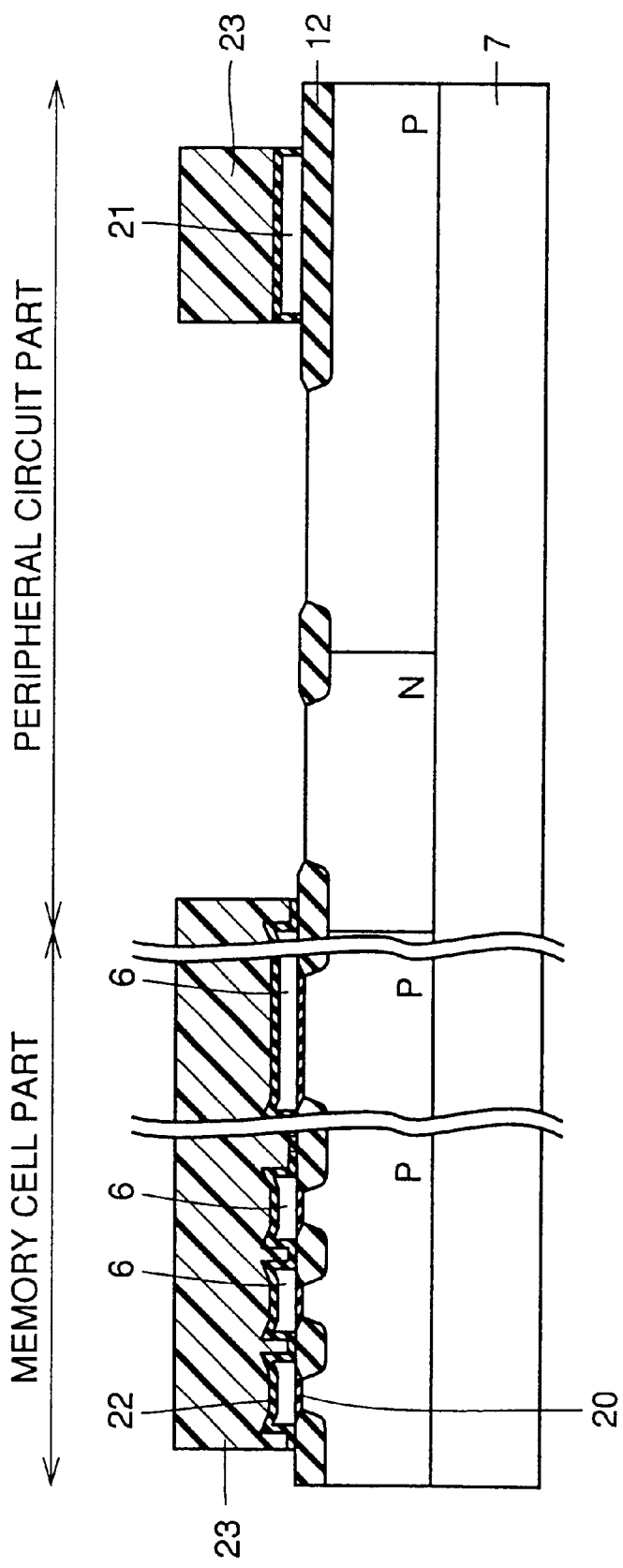
FIG. 5 is a sectional view showing a third step of the method of fabricating the nonvolatile semiconductor memory device according to the embodiment of the present invention.

Referring to FIG. 5, an interpoly dielectric film 22 in a three-layer structure of an oxide film, a nitride film and an oxide film having a thickness of about 150 to 200 nm in terms of each oxide film is formed on the semiconductor substrate 7, to cover the floating gates 6. Thereafter a part of the interpoly dielectric film 22 is removed from the peripheral circuit part excluding the matrix part 21 through a resist film 23.

Figure 6:
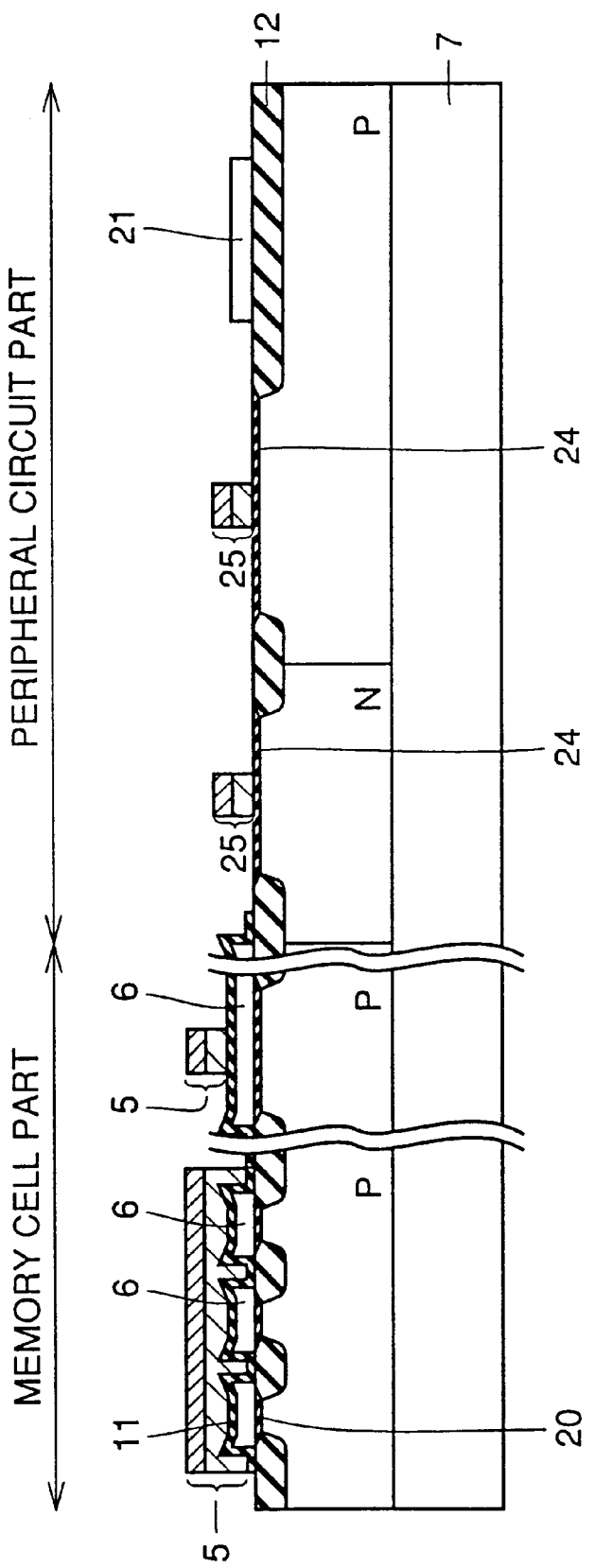
FIG. 6 is a sectional view showing a fourth step of the method of fabricating the nonvolatile semiconductor memory device according to the embodiment of the present invention.

Referring to FIGS. 5 and 6, the resist film 23 is removed and thereafter gate oxide films 24 for the peripheral circuit MOS transistors are formed by thermal oxidation. Thereafter the interpoly dielectric film 22 is removed also from the matrix part 21 for the polydiode element 2. Then, a control gate material of tungsten polycide consisting of tungsten silicide and phosphorus-doped N-type polysilicon in thicknesses of 100 nm and 100 nm is deposited and etched through photolithography, for forming the control gates 5 and peripheral circuit MOS transistor gates 25 in the memory cell part and the peripheral circuit part respectively. A part of the control gate material deposited on the matrix part 21 for the polydiode element 2 is removed at this time.

Figure 7:
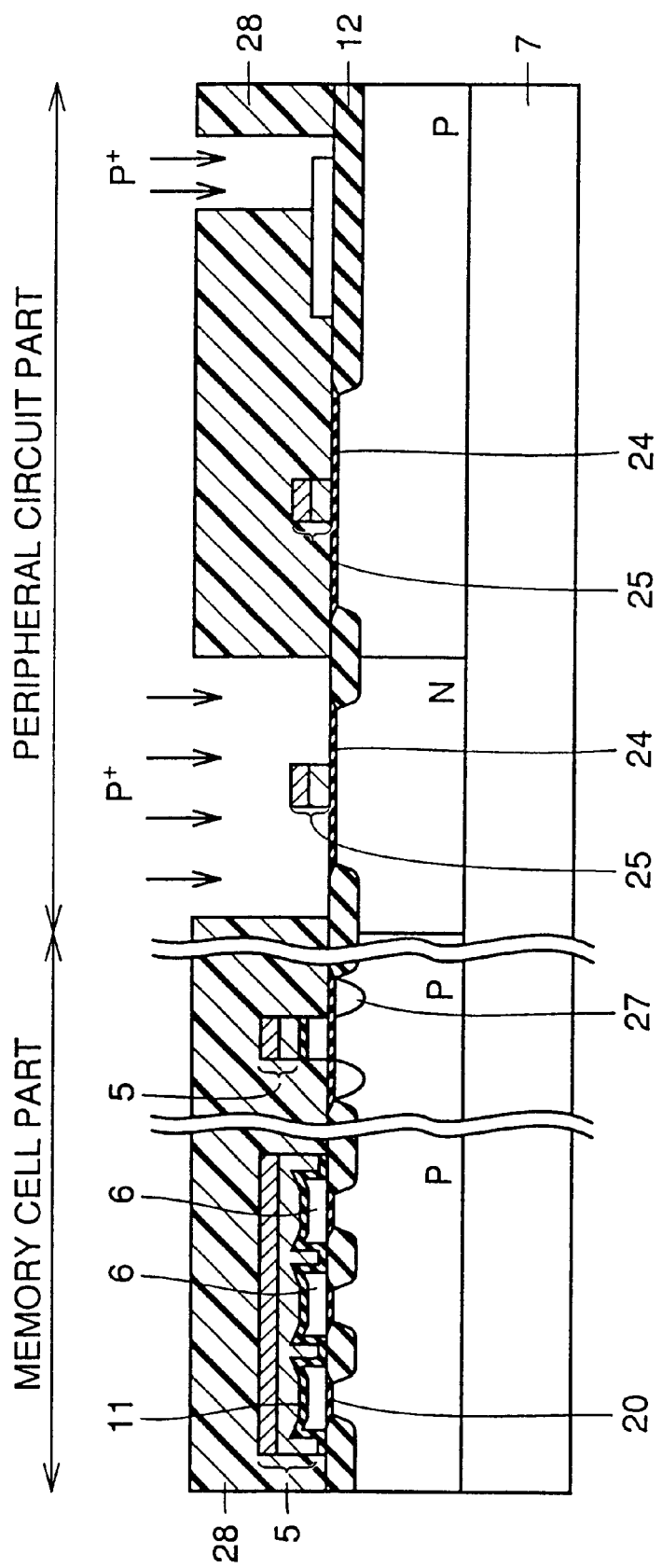
FIG. 7 is a sectional view showing a fifth step of the method of fabricating the nonvolatile semiconductor memory device according to the embodiment of the present invention.

Referring to FIGS. 6 and 7, the interpoly dielectric film 11 and the floating gates 6 provided under the same are etched through the control gates 5 serving as masks in the memory cells. Thereafter source/drain regions 27 of the memory cells are formed by ion implantation, thereby completing the memory cells. A resist pattern 28 is formed to cover the memory cell part and the MOS transistor parts, and $BF_2$ ions are injected into a partial region of the matrix part 21 for the polydiode element 2 at 20 KeV by about 2 to $4 \times 10^{15}$ atoms/cm$^2$ in P$^+$ ion implantation (boron or $BF_2$) for forming a P$^+$ diffusion layer of the peripheral circuit PMOS transistor. The injected region is inverted from an N type to a P type, to form a P-N junction.

The resist pattern 28 is removed.

Figure 8:
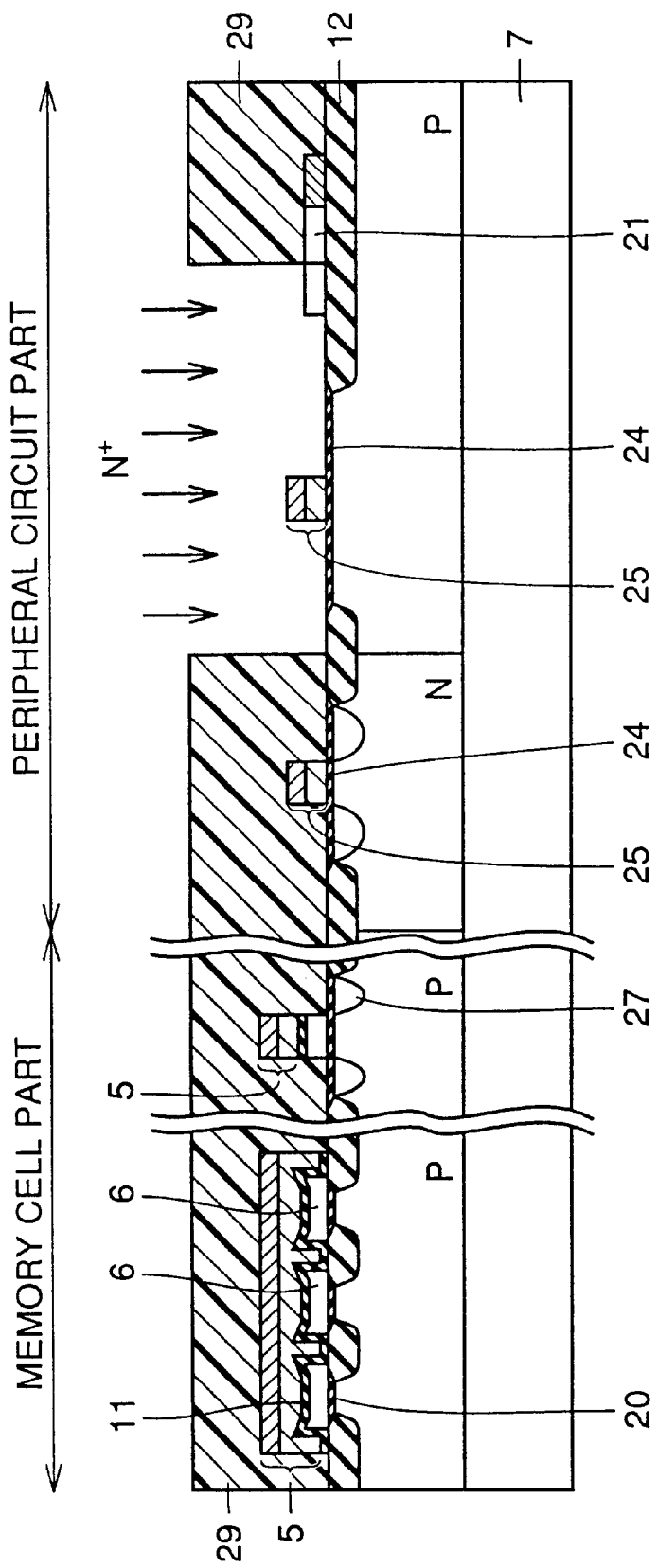
FIG. 8 is a sectional view showing a sixth step of the method of fabricating the nonvolatile semiconductor memory device according to the embodiment of the present invention.

Referring to FIG. 8, a resist pattern 29 is formed on the silicon substrate 7 to cover the memory cell part, the peripheral circuit PMOS transistor part and a part of the matrix part 21 for the polydiode element 2. This resist pattern 29 is employed as a mask for injecting As ions into a partial region of the matrix part 21 for the polydiode element 2 at 50 KeV by about 2 to $4 \times 10^{15}$ atoms/cm$^2$ in N$^+$ ion implantation (arsenic or phosphorus) for forming an N$^+$ diffusion layer of the peripheral circuit NMOS transistor, for reducing transverse resistance of the N-type region.

Figure 9:
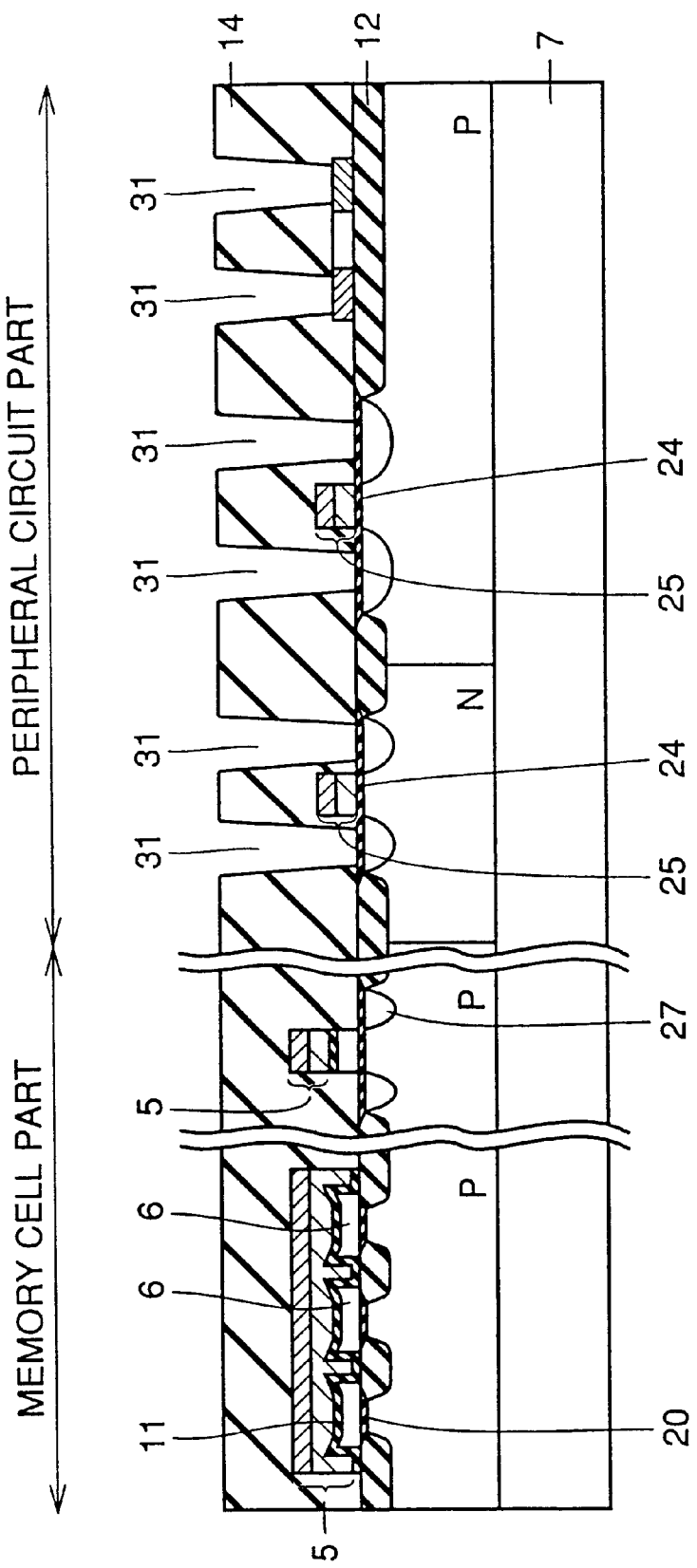
FIG. 9 is a sectional view showing a seventh step of the method of fabricating the nonvolatile semiconductor memory device according to the embodiment of the present invention.

Referring to FIG. 9, the interlayer isolation film 14 is formed on the silicon substrate 7, and contact holes 31 are formed in this interlayer isolation film 14 through photolithography and etching for exposing surfaces of the source/drain regions 27 of the PMOS and NMOS transistors and N and P surfaces of the polydiode element 2.

Figure 10:
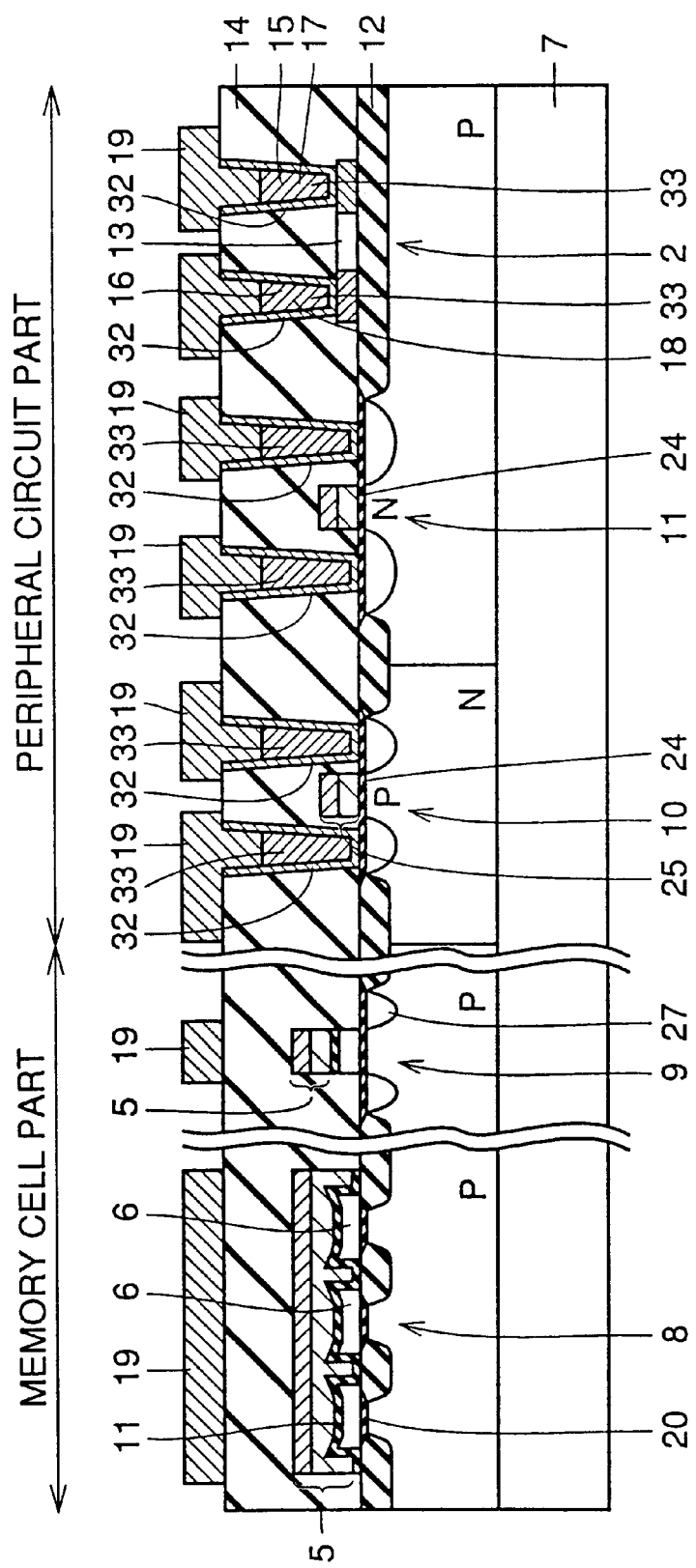
FIG. 10 is a sectional view showing an eighth step of the method of fabricating the nonvolatile semiconductor memory device according to the embodiment of the present invention.

Referring to FIGS. 9 and 10, barrier metal films 32 consisting of $TiSi_2$ and TiN are formed to cover bottom surfaces and side walls of the contact holes 31. A tungsten film is deposited on the overall upper surface of the silicon substrate 7 by CVD. The overall surface of this tungsten film is etched thereby embedding tungsten plugs 33 in the contact holes 31. Thus, the polydiode element 2 is completed. Then, an aluminum wiring material is deposited on the silicon substrate 7 for forming aluminum wires 19 through photolithography and etching, thereby completing the nonvolatile semiconductor memory device.

In the aforementioned embodiment, the floating gate material is employed as the material for the polydiode element 2. Further, a P$^+$ electrode of the polydiode element 2 is formed through P$^+$ ion implantation for the peripheral circuit PMOS transistor. Further, the resistance of an N$^+$ electrode part of the polydiode element 2 is reduced through N$^+$ ion implantation for the peripheral NMOS transistor. Thus, no excess step may be added for forming the polydiode element 2.

This embodiment may be modified as follows: A floating gate material is employed as the material for a polydiode element, while P$^+$ ion implantation for a peripheral PMOS transistor is employed for forming a P$^+$ electrode and N$^+$ ion implantation for forming source/drain regions of memory cells is employed for reducing the resistance of an N$^+$ electrode part. The polydiode element can also be formed by this process. Also in this modification, no excess step is added for forming the polydiode element, to require no excess cost.

The N$^+$ electrode of the polydiode element 2 may be formed simultaneously with N$^+$ ion implantation for forming source/drain regions of an NMOS memory cell transistor.

EXAMPLES

Examples of polydiode elements having various structures formed by the method according to the aforementioned embodiment are now described.

Example 1

Figure 11:
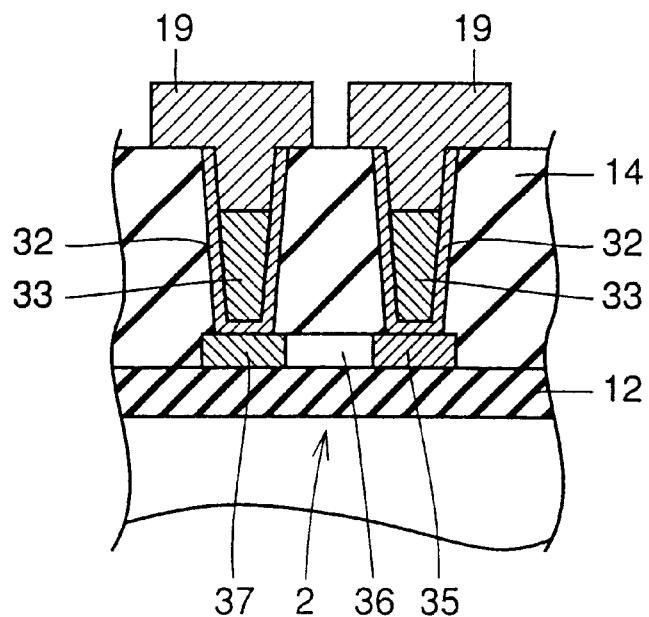
FIG. 11 is a sectional view of a polydiode element according to Example 1 of the present invention.

FIG. 11 is a sectional view showing the basic structure of a polydiode element according to Example 1 of the present invention. The polydiode element includes a P$^+$ part 35, an N$^+$ part 36 which is in contact with the P$^+$ part 35 and another N$^+$ part 37 having a higher concentration than the N$^+$ part 36. Aluminum wires 19 are connected to the P$^+$ part 35 and the N$^+$ part 37 through barrier metal films 32 and tungsten plugs 33.

Example 2

Figure 12:
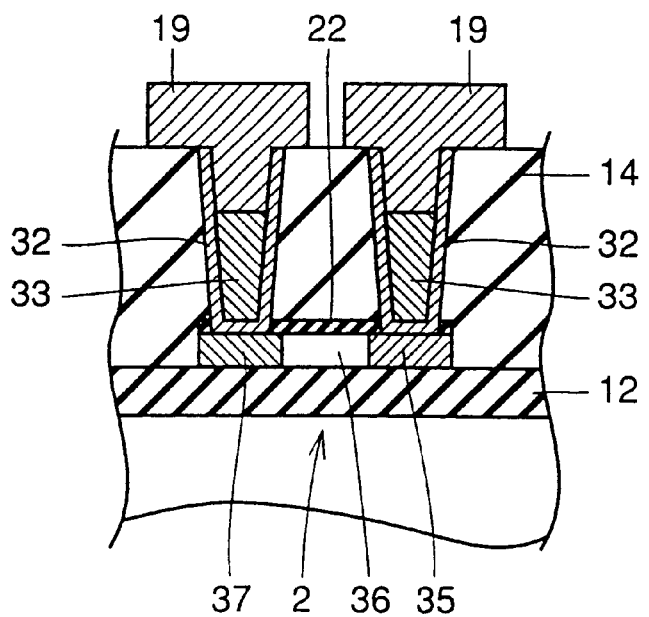
FIG. 12 is a sectional view of a polydiode element according to Example 2 of the present invention.

FIG. 12 is a sectional view of a polydiode element according to Example 2 of the present invention. The polydiode element shown in FIG. 12 is different from that shown in FIG. 11 in a point that a protective film 22 consisting of an interpoly dielectric film is formed on a P$^+$ part 35 and N$^+$ parts 36 and 37. Such a protective film 22 effectively prevents the polydiode element from contamination.

A method of fabricating the polydiode element shown in FIG. 12 is now described.

FIGS. 13A and 13B illustrate a modification of the step shown in FIG. 4. Referring to FIG. 13A, a floating gate material 26 is deposited in a step for forming a base for memory cells, similarly to the step shown in FIG. 4. The step shown in FIG. 13A is different from that shown in FIG. 4 in a point that a photolithographic pattern is changed for working the floating gate material 26 into stripes along a bit line direction in a memory cell part while leaving the same in a peripheral circuit part as illustrated.

Referring to FIG. 13A, an interpoly dielectric film 22 is then formed. Referring to FIG. 13B, parts of the interpoly dielectric film 22 and the floating gate material 6 located under the same are removed from a portion for forming the polydiode element in a peripheral circuit part through a resist film 37. Then the resist film 37 is removed. Thereafter gate oxide films for peripheral circuit MOS transistors are formed by thermal oxidation. Thereafter a nonvolatile semiconductor memory device is completed through steps similar to those shown in FIGS. 6 to 10. Thus, the polydiode element is obtained while leaving the interpoly dielectric film 22 thereon as a protective film.

Example 3

Figure 14:
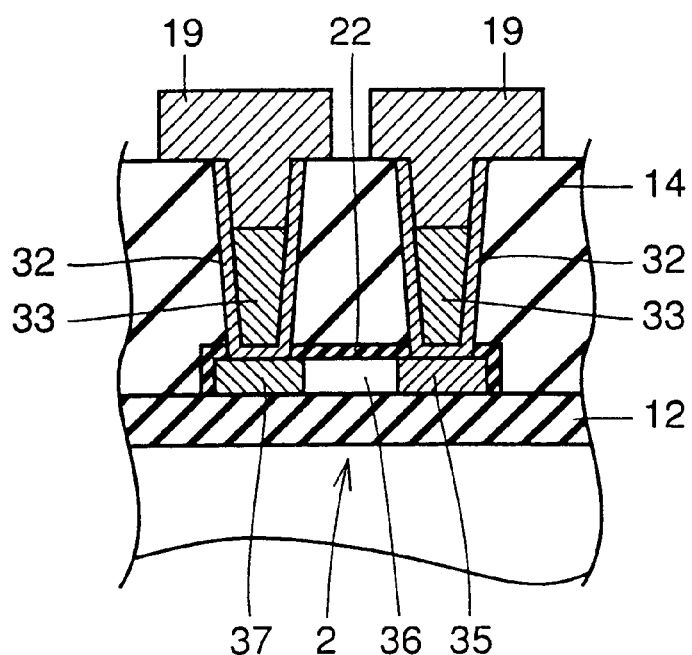
FIG. 14 is a sectional view of a polydiode element according to Example 3 of the present invention.

FIG. 14 is a sectional view showing a polydiode element according to Example 3 of the present invention. The polydiode element shown in FIG. 14 is different from that shown in FIG. 11 in a point that the overall surface of a P-N junction layer is covered with a protective film 22 made of the same material as an interpoly dielectric film.

A method of fabricating such a polydiode element is described.

Figure 15:
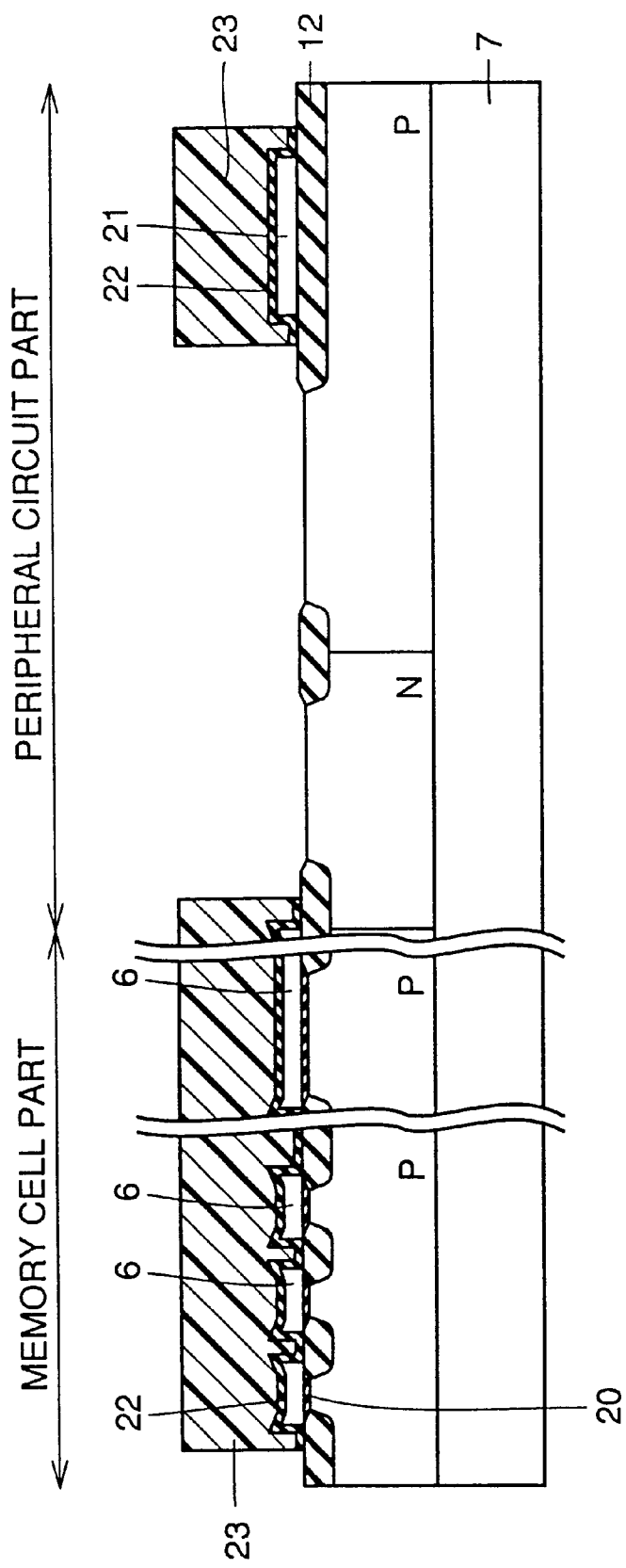
FIG. 15 is a sectional view of a semiconductor device showing a principal step of a method of fabricating the polydiode element according to Example 3 of the present invention.

First, steps similar to those shown in FIGS. 1 to 4 are carried out. Referring to FIG. 15, an interpoly dielectric film 22 is then formed on a silicon substrate 7, to cover floating gates 6 and a matrix part 21 for the polydiode element. Then, unnecessary parts of the interpoly dielectric film 22 are removed through a resist film 23 by photolithography. Thereafter steps similar to those shown in FIGS. 6 to 10 are carried out, thereby completing a nonvolatile semiconductor memory device shown in FIG. 14.

Example 4

Figure 16:
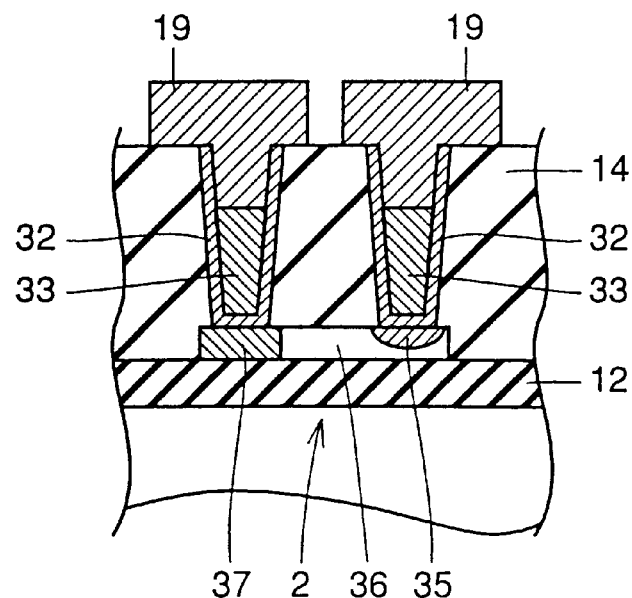
FIG. 16 is a sectional view of a polydiode element according to Example 4 of the present invention.

FIG. 16 is a sectional view of a polydiode element according to Example 4 of the present invention. The polydiode element shown in FIG. 16 is identical to that shown in FIG. 11 except a point described below, and hence parts identical or corresponding to those in FIG. 11 are denoted by the same reference numerals, to omit redundant description. The polydiode element shown in FIG. 16 is different from that shown in FIG. 11 in a point that a P-N junction surface (the boundary surface between a $P^+$ part 35 and an $N^+$ part 36) is formed in the vicinity of a contact hole. Such a polydiode element is formed by carrying out a step similar to that shown in FIG. 7 with no $P^+$ ion implantation while injecting $P^+$ ions into a P-type contact hole of the polydiode element in a step similar to that shown in FIG. 9.

Example 5

Figure 17:
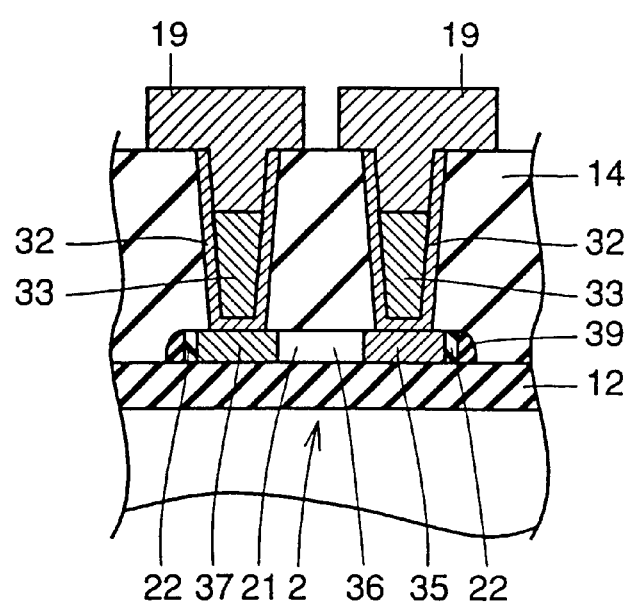
FIG. 17 is a sectional view of a polydiode element according to Example 5 of the present invention.

FIG. 17 is a sectional view of a polydiode element according to Example 5 of the present invention. The polydiode element shown in FIG. 17 is different from that shown in FIG. 14 in a point that protective films 22 are formed only on side walls of a matrix part 21. The polydiode element having such a structure is formed as follows:

First, steps similar to those shown in FIGS. 1 to 5 are carried out for leaving an interpoly dielectric film 22 on a polydiode part. Thereafter a step similar to that shown in FIG. 6 is carried out.

Figure 18:
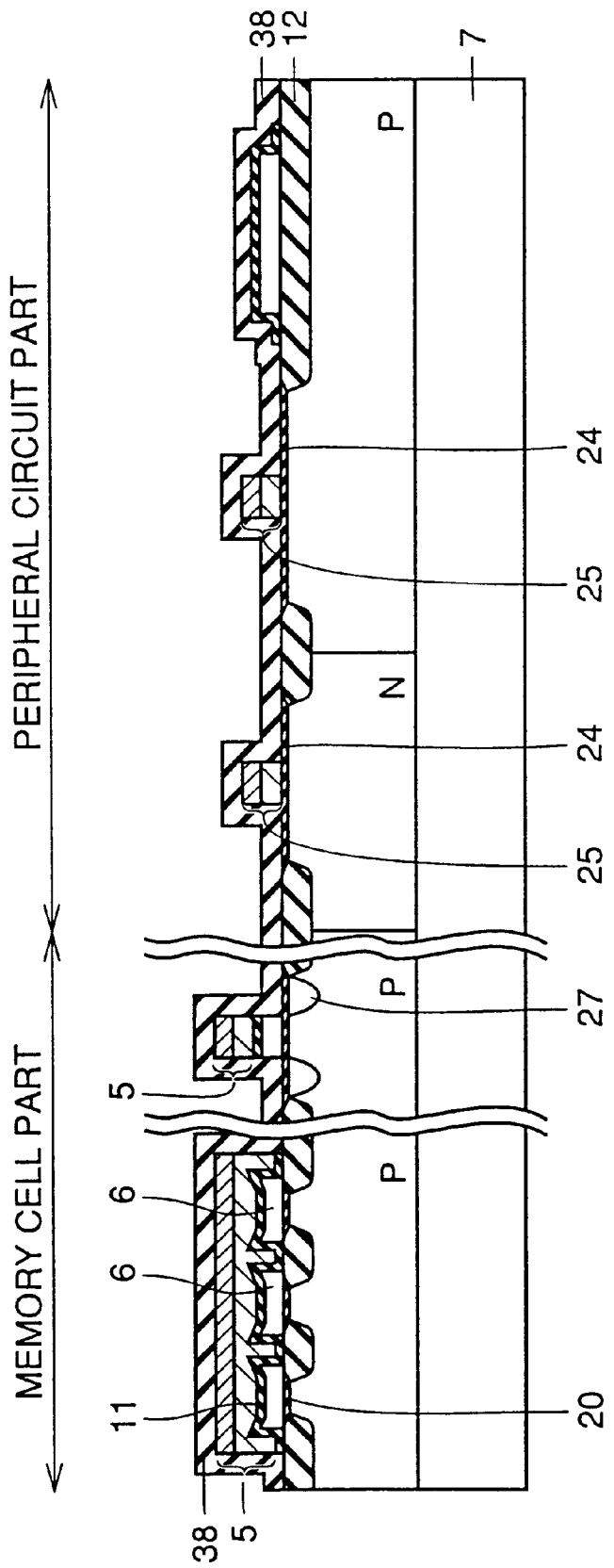
FIG. 18 is a sectional view of a semiconductor device showing a first step of a method of fabricating the polydiode element according to Example 5 of the present invention.

Referring to FIG. 18, a CVD oxide film 38 is thereafter deposited on the overall surface of a silicon substrate 7.

Figure 19:
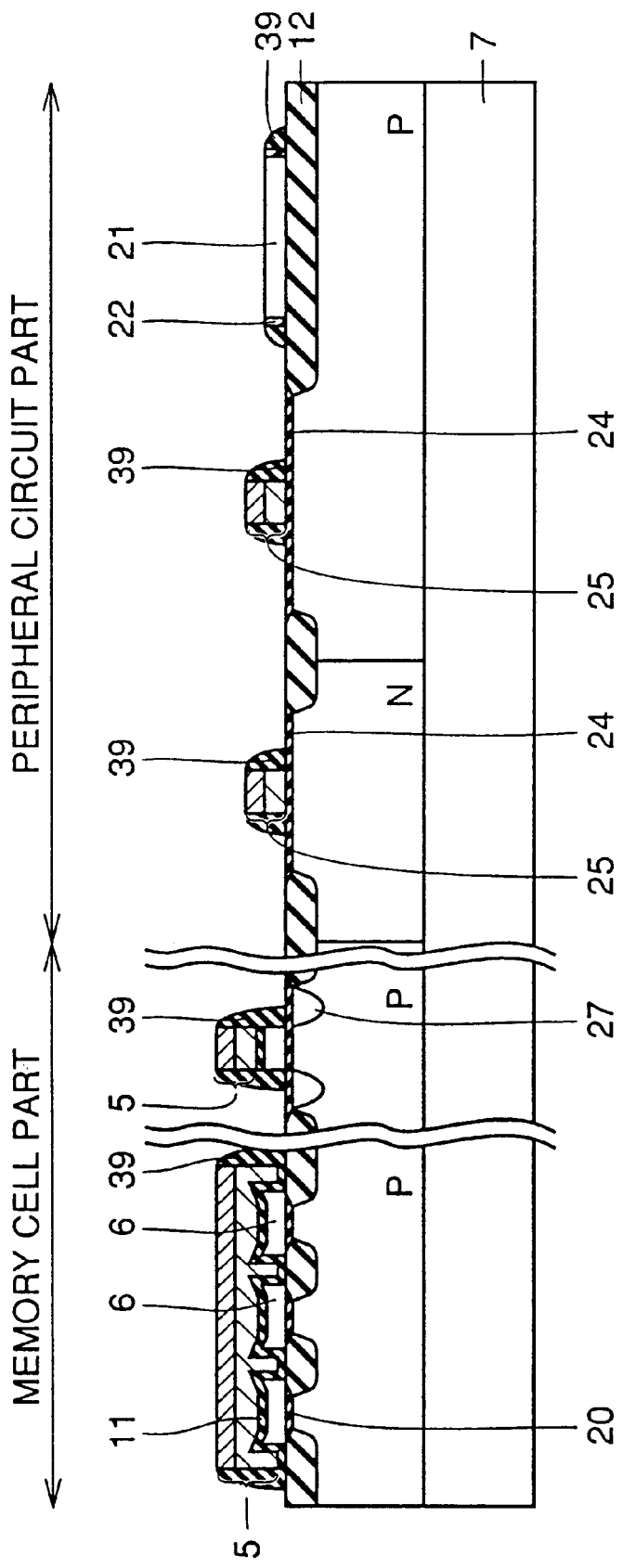
FIG. 19 is a sectional view of the semiconductor device showing a second step of the method of fabricating the polydiode element according to Example 5 of the present invention.

Referring to FIGS. 18 and 19, the CVD oxide film 38 is entirely etched back, thereby forming side wall spacers 39 while leaving parts of the interpoly dielectric film 22 on the side walls of the matrix part 21. The side wall spacers 39 are formed in order to bring peripheral transistors into LDD structures.

Thereafter steps identical to those shown in FIGS. 7 to 10 are carried out, thereby forming the polydiode element shown in FIG. 17.

Figure 20:
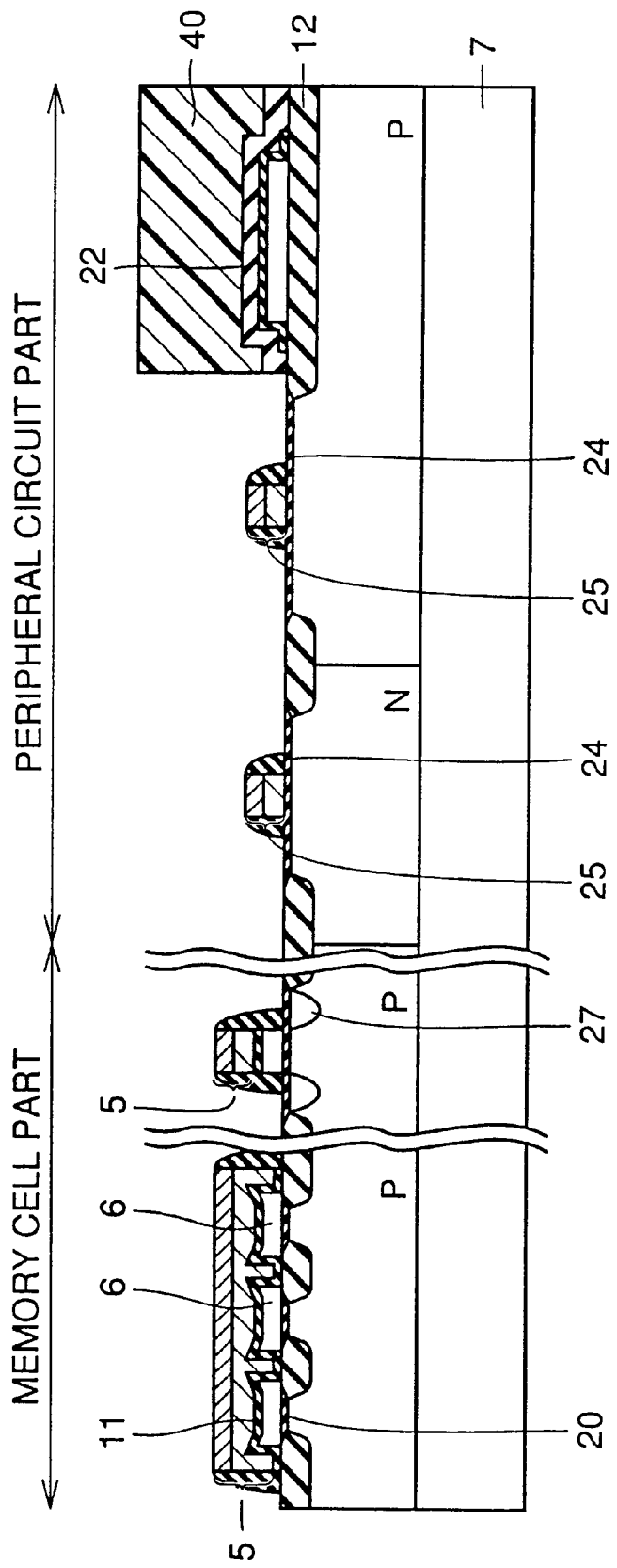
FIG. 20 is a sectional view of a semiconductor device showing a principal step of a method of fabricating a polydiode element according to a modification of any of Examples 1 to 5 of the present invention.

In case of bringing peripheral transistors into LDD structures in the steps of fabricating the polydiode element shown in FIG. 12, the interpoly dielectric film 22 formed on a P-N junction layer is disadvantageously removed if the CVD oxide film 38 is deposited on the overall surface as shown in FIG. 18 and entirely etched back as shown in FIG. 19 for forming the side wall spacers 39. In case of bringing the peripheral transistors into LDD structures, therefore, a diode part must be masked with a resist film 40 by photolithography for protecting the interpoly dielectric film 22 serving as a protective film in the step of etching back the oxide film 38, as shown in FIG. 20.

In general, a floating gate material is prepared from N-type polysilicon. In consideration of a cell operation of a nonvolatile semiconductor memory device such as a flash memory, for example, the thickness of the floating gate material is desirably minimized, in order to satisfy requirement for no depletion, large-scale integration and high density. The floating gate material for a general flash memory has a phosphorus concentration of $1 \times 10^{20}/cm^3$ to $6 \times 10^{20}/cm^3$ and a film thickness of not more than 200 nm.

While the floating gate material has a phosphorus concentration of $1 \times 10^{20}/cm^3$ and a thickness of 100 nm in the aforementioned embodiment of the present invention, the present invention is not restricted to this.

Further, the floating gate material employed in the step shown in FIG. 4 may be prepared by low-pressure CVD, or may be formed by depositing non-doped polysilicon and thereafter attaining a desired phosphorus concentration by thermal diffusion of phosphorus. Alternatively, the floating gate material may be formed by depositing non-doped polysilicon and thereafter attaining a desired phosphorus concentration by ion implantation of phosphorus.

Example 6

Figure 21:
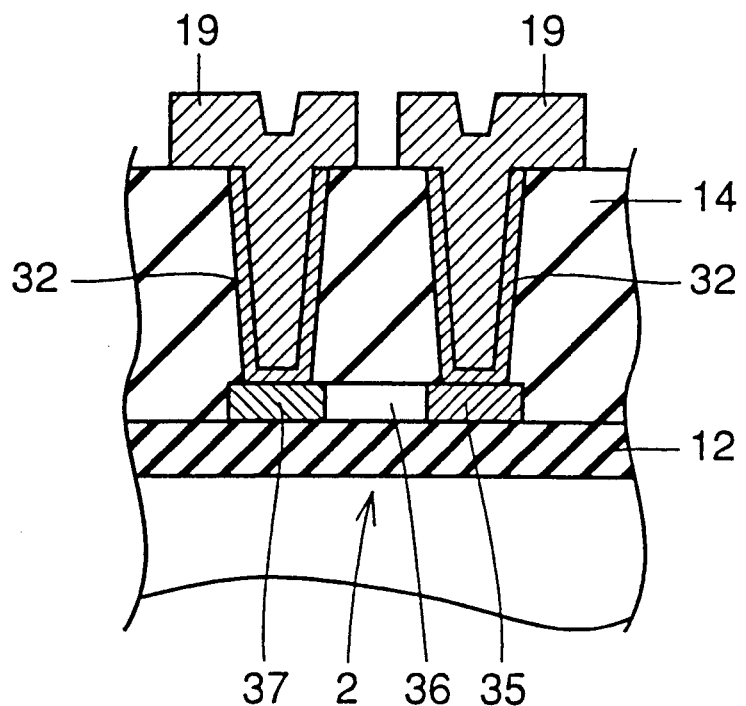
FIG. 21 is a sectional view of a polydiode element according to Example 6 of the present invention.

While resistive elements are formed by barrier metals and tungsten plugs in the aforementioned Examples, the present invention is not restricted to this. FIG. 21 is a sectional view of a polydiode element according to Example 6 of the present invention. In the polydiode element shown in FIG. 21, no tungsten plugs are employed but resistive elements are formed by only barrier metal films 32. Such resistive elements formed by only the barrier metal films 32 are sufficiently effective against surge, although the effect is reduced.

Although the barrier metal films 32 are made of $TiS_2$ and TiN in Examples 1 to 6, the present invention is not restricted to this but the barrier metal films 32 can alternatively be prepared from nitrides, carbides and borides of transition metals of the groups IV, V and VI and composite films thereof.

Figure 22:
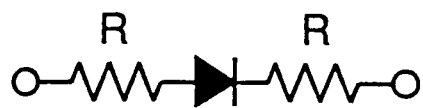
FIG. 22 is an equivalent circuit diagram of the polydiode element according to any of Examples 1 to 6 of the present invention.

FIG. 22 is an equivalent circuit diagram of the polydiode element obtained by any of Examples 1 to 6 of the present invention. Resistances R are added to both sides of the polydiode element for reducing a voltage directly applied to the polydiode element by a voltage drop when electrical noise such as surge is applied, thereby preventing the polydiode element from breaking.

Figure 23:
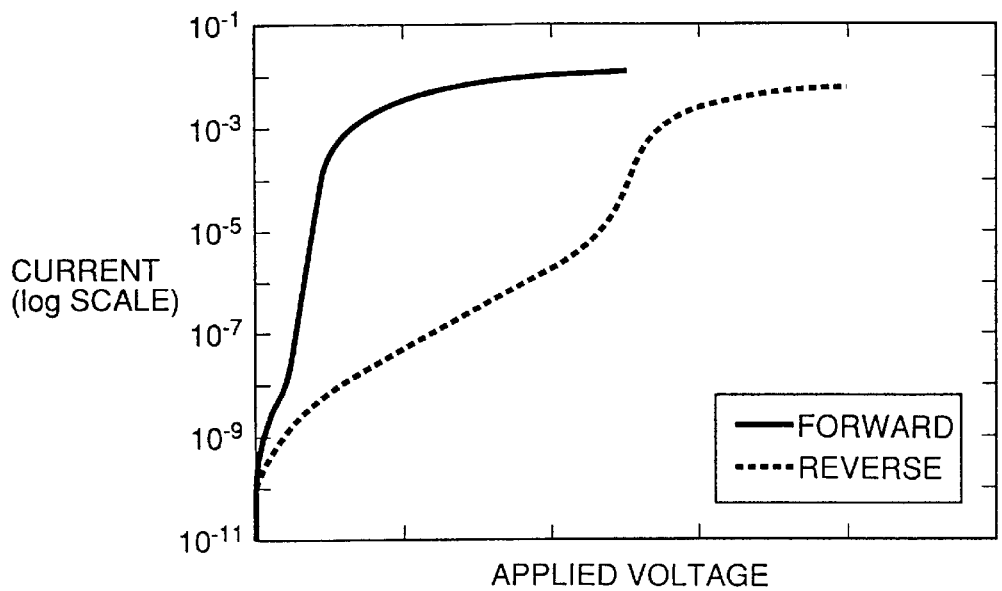
FIG. 23 illustrates a characteristic of the polydiode element according to any of Examples 1 to 6 of the present invention.
Figure 24:
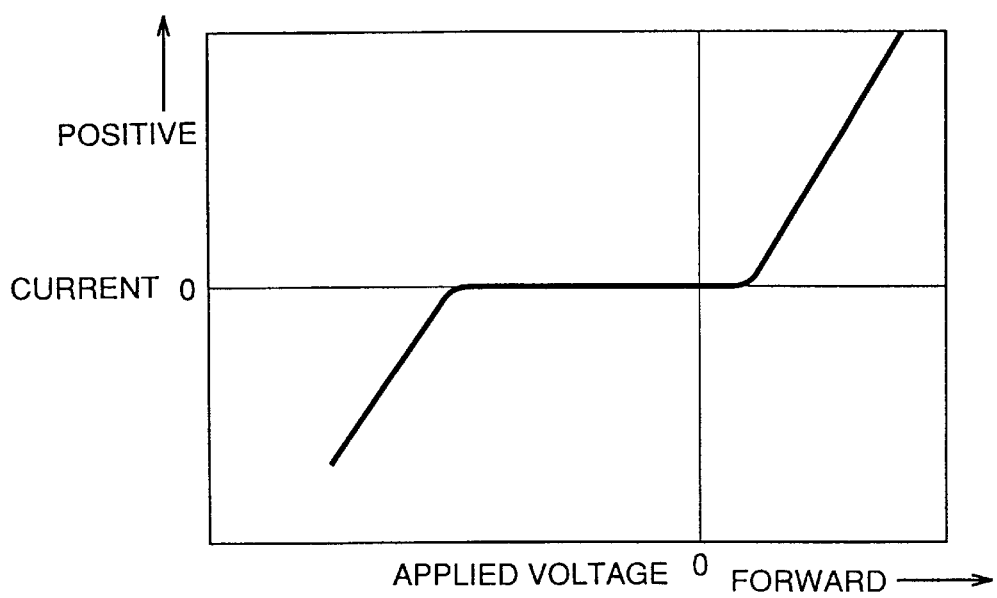
FIG. 24 illustrates another characteristic of the polydiode element according to any of Examples 1 to 6 of the present invention.

FIGS. 23 and 24 illustrate characteristics of the polydiode element obtained in any of Examples 1 to 6 of the present invention. FIG. 23 shows an I-V characteristic in a vertical axis log scale, and FIG. 24 shows an I-V characteristic in a vertical axis linear scale.

Various modes of polydiode elements based on N-type polysilicon are now described with reference to Examples 7 to 12 of the present invention.

Example 7

FIG. 25(A) shows a plan view of a polydiode element according to Example 7 of the present invention and FIG. 25(B) shows a sectional view taken along the line XXV(B)—XXV(B). In order to improve the forward characteristic of the polydiode element, N-type ions are injected into a region of N-type polysilicon other than a P-type ion implantation region for forming an $N^{++}$ region. The $N^{++}$ region is separated from a $P^+$ injection region at a constant distance, in order to ensure reverse voltage resistance.

Example 8

FIG. 26(A) shows a plan view of a polydiode element according to Example 8 of the present invention and FIG. 26(B) shows a sectional view taken along the line XXVI(B)—XXVI(B). P-type ions (boron or $BF_2$) are injected into N-type polysilicon. Injection energy is so sufficient that the polysilicon material is inverted to a P type up to its bottom portion in a $P^+$ injection region. The principal junction surface of the polydiode element is a vertical section along an edge surface of the $P^+$ injection region.

Example 9

FIG. 27(A) shows a plan view of a polydiode element according to Example 9 of the present invention and FIG. 27(B) shows a sectional view taken along the line XXVII(B)—XXVII(B).

P-type ions (boron or $BF_2$) are injected into N-type polysilicon. Injection energy is so small that a shallow layer of the polysilicon material is inverted to a P type in a $P^+$ injection region. The principal junction surface of the polydiode element is the bottom portion of the shallow $P^+$ injection region.

Example 10

FIG. 28(A) shows a plan view of a polydiode element according to Example 10 of the present invention and FIG. 28(B) shows a sectional view taken along the line XXVIII(B)—XXVIII(B).

In order to improve the forward characteristic of the polydiode element, N-type ions are injected into a region of N-type polysilicon other than a P-type ion implantation region. A $P^+$ injection region and an $N^+$ injection region are overlapped with each other by a constant distance, in order to ensure reverse voltage resistance. The overlapped portion defines an $N^-$ layer or a $P^-$ layer.

Example 11

FIG. 29(A) shows a plan view of a polydiode element according to Example 11 of the present invention and FIGS. 29(B), 29(C) show sectional views taken along the lines XXIX(B)—XXIX(B) and XXIX(C)—XXIX(C).

In order to reduce reverse leakage, the width of a portion including junction surfaces is reduced below a constant width d, and a plurality of diodes are connected in parallel with each other. The constant width d, which is not more than several times the grain size of polysilicon, is not more than 1 $\mu$m.

Example 12

FIG. 30(A) shows a plan view of a polydiode element according to Example 12 of the present invention and FIG. 30(B) shows a sectional view taken along the line XXX(B)—XXX(B).

The distance between an $N^+$ +injection region and a $P^+$ injection region is identical to the width Lg of a mask material.

Figure 31A:
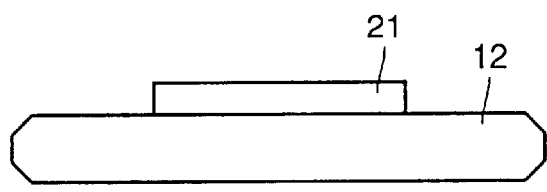
FIGS. 31A and 31B are a sectional view and a plan view of a semiconductor device showing a first step of a method of fabricating the polydiode element according to Example 12 of the present invention.
Figure 31B:
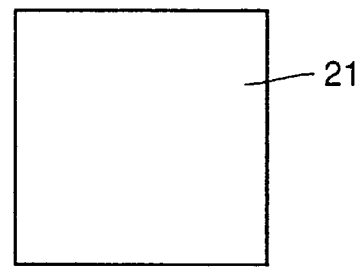

Such a polydiode element is fabricated as follows:

Referring to FIGS. 31A and 31B showing a sectional view and a plan view of the polydiode element respectively, a matrix part 21 for the polydiode element is formed on a field oxide film 12.

Figure 32:
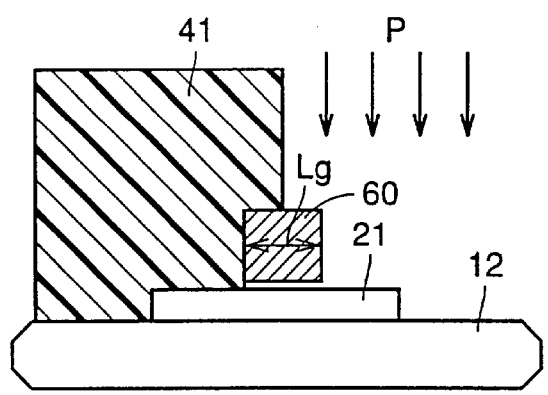
FIG. 32 is a sectional view of the semiconductor device showing a second step of the method of fabricating the polydiode element according to Example 12 of the present invention.

Referring to FIG. 32, a mask material 60 having the width Lg is provided on the matrix part 21 simultaneously in a step of forming a control gate. A resist film 41 for forming a mask for $P^+$ ion implantation is formed on the mask material 60, so that no P-type ions are injected into the region masked with the resist film 41 and the mask material 60.

Figure 33:
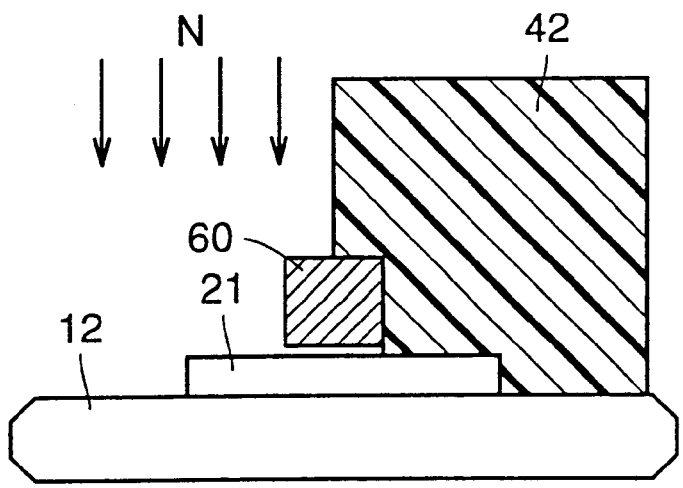
FIG. 33 is a sectional view of the semiconductor device showing a third step of the method of fabricating the polydiode element according to Example 12 of the present invention.

Referring to FIG. 33, a resist film 42 for a mask for $N^+$ ion implantation is formed on the mask material 60, so that no N-type ions are injected into the region masked with the resist film 42 and the mask material 60.

Figure 34:
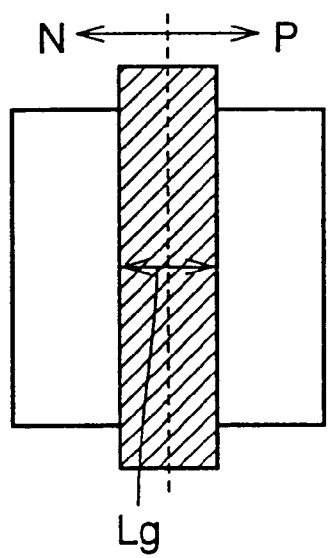
FIG. 34 is a sectional view of the semiconductor device showing a fourth step of the method of fabricating the polydiode element according to Example 12 of the present invention.

Referring to FIG. 34, the polydiode element is obtained with a P-type ion implantation region and an N-type ion implantation region separated from each other by a constant distance identical to the width Lg.

Modes of structures of polydiode elements based on non-doped polysilicon are now described with reference to Examples 13 to 15.

Example 13

FIG. 35(A) shows a plan view of a polydiode element according to Example 13 of the present invention and FIG. 35(B) shows a sectional view taken along the line XXXV(B)—XXXV(B).

P-type ions (boron or $BF_2$) and N-type ions (As or phosphorus) are injected into non-doped polysilicon. Injection energy is so sufficient that an $N^+$ injection region and a $P^+$ injection region are inverted to an N or P type up to a bottom portion of the polysilicon material.

Example 14

FIG. 36(A) shows a plan view of a polydiode element according to Example 14 of the present invention and FIG. 36(B) shows a sectional view taken along the line XXXVI(B)—XXXVI(B).

An $N^+$ injection region and a $P^+$ injection region are overlapped with each other by a constant distance, in order to ensure reverse voltage resistance.

Example 15

FIG. 37(A) shows a plan view of a polydiode element according to Example 15 of the present invention and FIG. 37(B) shows a sectional view taken along the line XXXVII(B)—XXXVII(B).

N-type ions (As or phosphorus) are injected into the overall surface of non-doped polysilicon. Injection energy is so sufficient that an $N^+$ injection region is inverted to an N type up to a bottom portion of the polysilicon material. Further, P-type ions (boron or $BF_2$) are injected into a partial region. In a $P^+$ injection region, injection energy is so small that a shallow layer is inverted to a P type. A principal junction surface of the polydiode element is the bottom portion of the shallow $P^+$ injection layer. A reverse type polydiode element having reverse N and $P^+$ injection regions also attains a similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device having a peripheral circuit PMOS transistor and a P-N function polydiodie element having an N-type layer and a P-type layer, comprising the steps of:

forming an element isolation oxide film on a surface of a semiconductor substrate;

forming a polysilicon layer serving as a matrix for said polydiode element on said element isolation oxide film;

injecting $P^+$ ion into said polysilicon layer simultaneously with $P^+$ ion implantation for forming a sorce/drain region of said PMOS transistor, thereby forming said P-type layer of said polydiode element;

forming said N-type layer of said polydiode element; and forming said PMOS transistor on said semiconductor substrate.

2. A method of fabricating a semiconductor device comprising a PMOS transistor, NMOS transistor and a P-N junction polydiode element an N-type layer and a P-type layer, comprising the steps of:

forming an element isolation oxide film on a surface of a semiconductor substrate;

forming a polysilicon layer serving as a matrix for said polydiode element on said element isolation oxide film;

injecting $P^+$ ion into said polysilicon layer simultaneously with $P^+$ ion implantation for forming a sorce/drain region of said PMOS transistor, thereby forming said P-type layer; injecting $N^+$ ion into said polysilicon layer simultaneously with $P^+$ ion implantation for forming a sorce/drain region of said NMOS transistor, thereby forming said P-type layer; and forming said PMOS transistor and said NMOS transistor on said semiconductor substrate.

3. The method of fabricating the semiconductor device according to claim 2, wherein said PMOS transistor includes a PMOS transistor for a peripheral circuit and said NMOS transistor includes an NMOS transistor for the peripheral circuit.

4. The method of fabricating the semiconductor device according to claim 2, wherein said NMOS transistor includes an NMOS-type memory cell transistor.

* * * * *

UNITED STATES PATENT AND TRADEMARK OFFICE
CERTIFICATE OF CORRECTION

PATENT NO. : 6,387,745 B1
DATED : May 14, 2002
INVENTOR(S) : Hiroshi Onoda et al.

It is certified that error appears in the above-identified patent and that said Letters Patent is hereby corrected as shown below:

Column 15,
Line 3, delete "function" and replace with -- junction --
Line 4, delete "polydiodie" and replace with -- polydiode --

Signed and Sealed this

Twenty-fifth Day of February, 2003

JAMES E. ROGAN
*Director of the United States Patent and Trademark Office*